United States Patent [19]

Kuge et al.

[11] Patent Number: 5,604,707
[45] Date of Patent: Feb. 18, 1997

[54] SEMICONDUCTOR MEMORY DEVICE RESPONSIVE TO HIERARCHICAL INTERNAL POTENTIALS

[75] Inventors: Shigehiro Kuge; Shigeki Tomishima; Kazutami Arimoto; Hideto Hidaka; Takahiro Tsuruda, all of Hyogo, Japan

[73] Assignee: Mitsubishi Denki Kabushiki Kaisha, Tokyo, Japan

[21] Appl. No.: 466,049

[22] Filed: Jun. 6, 1995

[30] Foreign Application Priority Data

Sep. 19, 1994 [JP] Japan .................................. 6-223040

[51] Int. Cl.[6] .................................................. G11C 7/00
[52] U.S. Cl. .................... 365/226; 365/189.09; 365/227; 365/230.03
[58] Field of Search ................................... 365/226, 227, 365/189.09, 230.03, 203

[56] References Cited

U.S. PATENT DOCUMENTS

| | | | |
|---|---|---|---|
| 4,691,304 | 9/1987 | Hori et al. | 365/226 |
| 5,278,786 | 1/1994 | Kawauchi et al. | 365/230.03 X |
| 5,282,171 | 1/1994 | Tokami et al. | 365/226 X |

OTHER PUBLICATIONS

"Subthreshold–Current Reduction Circuits for Multi–Gigabit Dram's" by Takeshi Sakata et al., Symposium on VLSI Circuits '93 pp. 45–46.

*Primary Examiner*—Son T. Dinh
*Attorney, Agent, or Firm*—Lowe, Price, LeBlanc & Becker

[57] ABSTRACT

A semiconductor memory device includes a semiconductor substrate, a plurality of memory blocks, first and second substrate potential generating circuits and a select circuit. The semiconductor substrate includes a plurality of wells corresponding to the memory blocks. Each memory block includes a plurality of memory cells formed on corresponding wells. The select circuit supplies to the well of the activated memory block a deep substrate potential generated by the first substrate potential generating circuit, and supplies to the well of the unselected memory block a shallow substrate potential generated by the second substrate potential generating circuit. Thereby, the minimum operation in the inactive memory block is ensured in spite of the fact that a power consumption of the inactive memory block is reduced.

11 Claims, 21 Drawing Sheets

SEMICONDUCTOR MEMORY DEVICE RESPONSIVE TO HIERARCHICAL INTERNAL POTENTIALS

CROSS-REFERENCE TO RELATED APPLICATIONS

This application is related to copending applications Ser. No. 08/312,968, filed Sep. 30, 1994 and commonly assigned with the present invention.

BACKGROUND OF THE INVENTION

1. Field of the Invention

The present invention relates to a semiconductor memory device, and in particular to a dynamic random access memory (DRAM) which operates based on internal potentials such as a substrate potential, a cell plate potential, a precharge potential for bit line, a boosted ground potential and a boosted power supply potential.

2. Description of the Background Art

In general, semiconductor memory devices are broadly classified into volatile memories such as an RAM and non-volatile memories such as an ROM. Volatile memories are broadly classified into DRAMs and static random access memories (SRAMs). Non-volatile memories are broadly classified into a mask ROM, an EPROM, a flash memory, an EEPROM and a fuse ROM.

Since the DRAM stores data by accumulating electric charges in a capacitor of a memory cell, it requires a refresh operation. However, memory cells have a simple structure. Therefore, DRAMs having a large-scale memory capacity can be formed with a low cost.

The DRAM is formed on one semiconductor substrate, which is supplied with a negative potential Vbb. A cell plate of a capacitor is supplied with a predetermined cell plate potential Vcp. Cell plate potential Vcp is, for example, half a power supply potential, i.e., Vcc/2 or a ground potential Vss. Bit line pair is precharged to a predetermined precharge potential Vbl before activation of a sense amplifier. Precharge potential Vbl is, for example, the power supply potential Vcc or half the power supply potential, i.e., Vcc/2.

The same assignee as the present invention has proposed in U.S. patent application Ser. No. 08/312,968, filed Sep. 30, 1994, a so-called a voltage-boosted sense ground method for the purpose of reducing a power consumption and an access time. According to this voltage-boosted sense ground method, a boosted ground potential Vss' slightly higher than the normal ground potential Vss is supplied to an N-channel side of the sense amplifier.

In the write operation of DRAM, a word line is supplied with a boosted power supply potential Vpp higher than power supply potential Vcc. Boosted power supply potential Vpp must be higher than power supply potential Vcc by at least a threshold voltage of a transfer gate in the memory cell. When the potential of word line is boosted, sufficient electric charges are accumulated in a cell capacitor. The same assignee as the present invention has proposed, in U.S. patent application Ser. No. 08/357,007, filed Dec. 16, 1994, a technique for forming hierarchical lines supplied with such a boosted power supply potential. This technique is disclosed also in "Subthreshold-Current Reduction Circuits for Multi-Gigabit DRAM's", 1993 Symposium on VLSI Circuits Digest of Technical Papers, pp. 45–46.

(1) In connection with substrate potential Vbb

In the DRAM, electric charges accumulated in the cell capacitor leak as described above, so that the cell capacitor must be periodically refreshed. This leak is caused by the flow from the cell capacitor through the transfer gate and the flow from the cell capacitor to a substrate or a neighboring memory cell. The former is called "disturb refresh" and the latter is called "pause refresh".

FIG. 27 is a cross section showing a structure of the memory cell in the DRAM. Referring to FIG. 27, a memory cell 1 is formed on a semiconductor substrate 4. One memory cell 1 is formed of one transfer gate 2 and one cell capacitor 3. Transfer gate 2 is formed of two N-type source/drain regions 5 and a gate electrode forming a word line WL. Cell capacitor 3 is formed of a storage node 6 in contact with one of source/drain regions 5 and a cell plate 7. The other source/drain region 5 is connected to a bit line BL. When the potential of word line WL attains the boosted power supply potential Vpp, transfer gate 2 becomes conductive, and the potential of bit line BL is supplied to storage node 6. Thereby, data is stored in cell capacitor 3.

A problem of the capacitor disturb refresh will be described below. It is assumed that memory cell 1 has initially stored data at H-level. Since the potential of word line WL is at the L (logical low) level of this memory cell 1, transfer gate 2 is non-conductive. In this state, when the potential of word line WL in the neighboring memory cell attains Vpp level, the potential of word line WL of this memory cell 1 slightly rises. This is due to the fact that the mutually neighboring word lines WL are coupled together via a parasitic capacitance 8. Therefore, transfer gate 2 becomes slightly conductive, whereby a subthreshold current Isth flows through a channel region under the word line WL. In accordance with miniaturization of transfer gate 2, its threshold voltage decreases. Therefore, subthreshold current Isth increases in accordance with miniaturization of transfer gate 2. In order to overcome this problem, negative substrate potential Vbb at an allowable minimum level is applied to P-type semiconductor substrate 4 in the DRAM. The reason for this is that as substrate potential Vbb is deepened, the substrate effect increases the threshold voltage, so that subthreshold current Isth decreases.

A problem of the pause refresh will be described below. The electric charges stored in storage node 6 leak as subthreshold current Isth, and also leak to semiconductor substrate 4 via a PN junction of source/drain region 5 formed under storage node 6. Electric charges accumulated in storage node 6 further leak to a neighboring memory cell through semiconductor substrate 4 under an element isolating film 9 such as LOCOS.

FIG. 28 is a graph showing a relationship between a pause time in refresh and the number of defective memory cell(s). As can be seen from this graph, if the substrate potential Vbb is deep, the defective memory cell appears at an area where the pause time is short. If substrate potential Vbb is shallow, the defective memory cell appear at an area where the pause time is long. Therefore, shallower substrate potential Vbb can increase the pause time. The reason for this is that as the substrate potential Vbb becomes shallow, the voltage applied to a depletion layer around source/drain regions 5 decreases, so that an electric field in the depletion layer decreases. Therefore, generation of minority carriers is suppressed, which reduces the leak current flowing from source/drain regions 5 to semiconductor substrate 4.

As described above, the leak current from the memory cell increases if substrate potential Vbb is excessively shallow or excessively deep. In the conventional DRAM, semiconductor substrate 4 is entirely supplied with substrate potential Vbb which is neither shallow nor deep so as to prevent remarkable problems relating to the disturb refresh and pause refresh. Therefore, it is impossible to prevent substantially the leak current from memory cell 1.

(2) In connection with cell plate potential Vcp and bit line precharge potential Vb1.

As described before, cell plate 7 is supplied with the potential, e.g., of Vcc/2 which is half the power supply potential. During standby, bit line BL is also supplied with the potential, e.g., of Vcc/2 which is half the power supply potential. An intermediate potential generating circuit for generating the intermediate potential Vcc/2 must have such features that its output potential is hardly influenced by variation of process conditions and its output impedance is low. A large amount of current always flows in the intermediate potential generating circuit, because a transistor functioning as a diode and a transistor at the output stage must have large sizes. This results in a problem that the intermediate potential generating circuit consumes a large amount of current.

(3) In connection with boosted ground potential Vss'

Although the voltage-boosted sense ground method described before significantly reduces the power consumption of DRAM, further reduction of the power consumption is required. In the DRAM employing the voltage-boosted sense ground method, it is necessary to reduce the test time for determining whether memory cells are accepted or not.

(4) In connection with boosted power supply potential Vpp

Although hierarchization of boosted power supply lines significantly reduces the power consumption of DRAM as described before, further reduction of power consumption is necessary. It is also necessary to check the leak current from the hierarchical segment boosted power supply lines.

SUMMARY OF THE INVENTION

An object of the invention is to provide a semiconductor memory device of which power consumption is small.

Another object of the invention is to provide a semiconductor memory device of which access time is short.

Still another object of the invention is to provide a semiconductor memory device of which data holding time is long.

Yet another object of the invention is to provide a semiconductor memory device in which the number of times of refresh per time is small.

Further another object of the invention is to provide a semiconductor memory device which allows easy test of a boosted ground line.

A further object of the invention is to provide a semiconductor memory device which allows easy test of a boosted power supply line.

A semiconductor memory device according to an aspect of the invention includes a plurality of memory blocks, a first internal potential generating circuit and a select circuit. Each of the plurality of memory blocks stores a plurality of data, and is activated in response to a corresponding block select signal. The first internal potential generating circuit generates a first internal potential for the memory block such as a substrate potential, a cell plate potential, a precharge potential or a boosted ground potential. The select circuit selects active one among the memory blocks and supplies the first internal potential generated by the first internal potential generating circuit to the selected memory block.

Preferably, the semiconductor memory device further includes a second internal potential generating circuit. The second internal potential generating circuit generates a second internal potential for the memory blocks. The select circuit supplies to the unselected memory block the second internal potential generated by the second internal potential generating circuit.

Preferably, in the semiconductor memory device, the select circuit includes a plurality of transistors. The plurality of transistors are provided correspondingly to the memory blocks. Each of the transistors is connected between an output node of the first internal potential generating circuit generating the first internal potential and an input node of the corresponding memory block to be supplied with the first internal potential, and is turned on in response to the block select signal supplied to the corresponding memory block.

More preferably, the select circuit includes a plurality of resistance elements. The plurality of resistance elements are provided correspondingly to the memory blocks. Each of the plurality of element resistances is connected in parallel to the corresponding transistor.

Accordingly, the semiconductor memory device of the above aspect, the first internal potential is supplied only to the activated one among the plurality of memory blocks, so that the power consumption is reduced as compared with the case where the first internal potential is supplied to all the memory blocks.

According to the preferred aspect, since the second internal potential is supplied to the unselected memory blocks, minimum operation of the unselected memory blocks is ensured.

According to the another preferred aspect, since the first internal potential is supplied to the memory block via the transistor which is turned on in response to the block select signal, and the first internal potential is supplied to the unselected memory blocks via the resistance elements, so that minimum operation of the unselected memory blocks is ensured.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 29(a)–2(c) is a timing chart showing a conventional CBR refresh cycle;

FIG. 30(a)–3(c) is a timing chart showing a conventional CBR self-refresh cycle; and FIG. 31(a)–3(c) is a timing chart showing operation in the conventional test mode.

DESCRIPTION OF THE PREFERRED EMBODIMENTS

Figure 1:
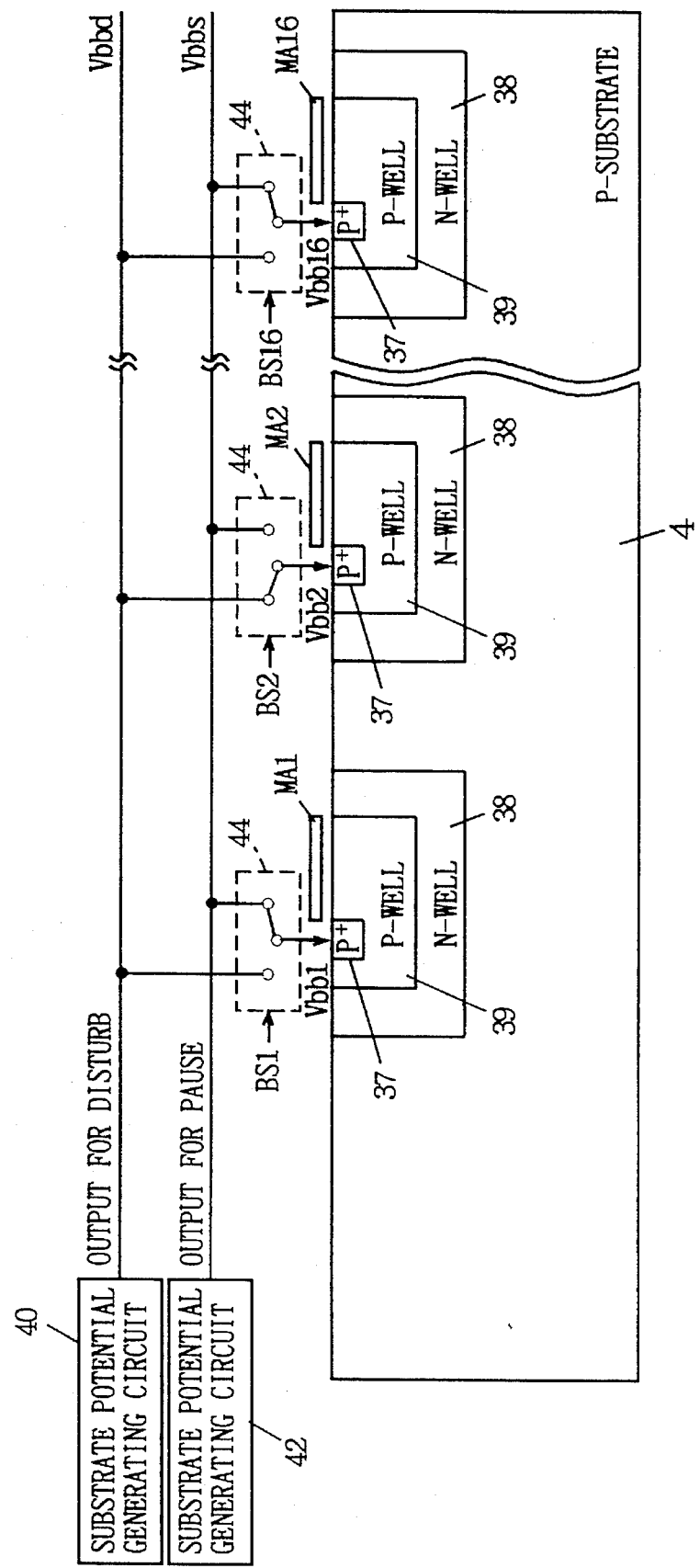
FIG. 1 conceptually shows a structure of a DRAM according to an embodiment 1 of the invention.

Embodiments of the invention will be described below with reference to the drawings. In the drawings, the same reference numbers indicate the same or corresponding portions.

[Embodiment 1]

Figure 2:
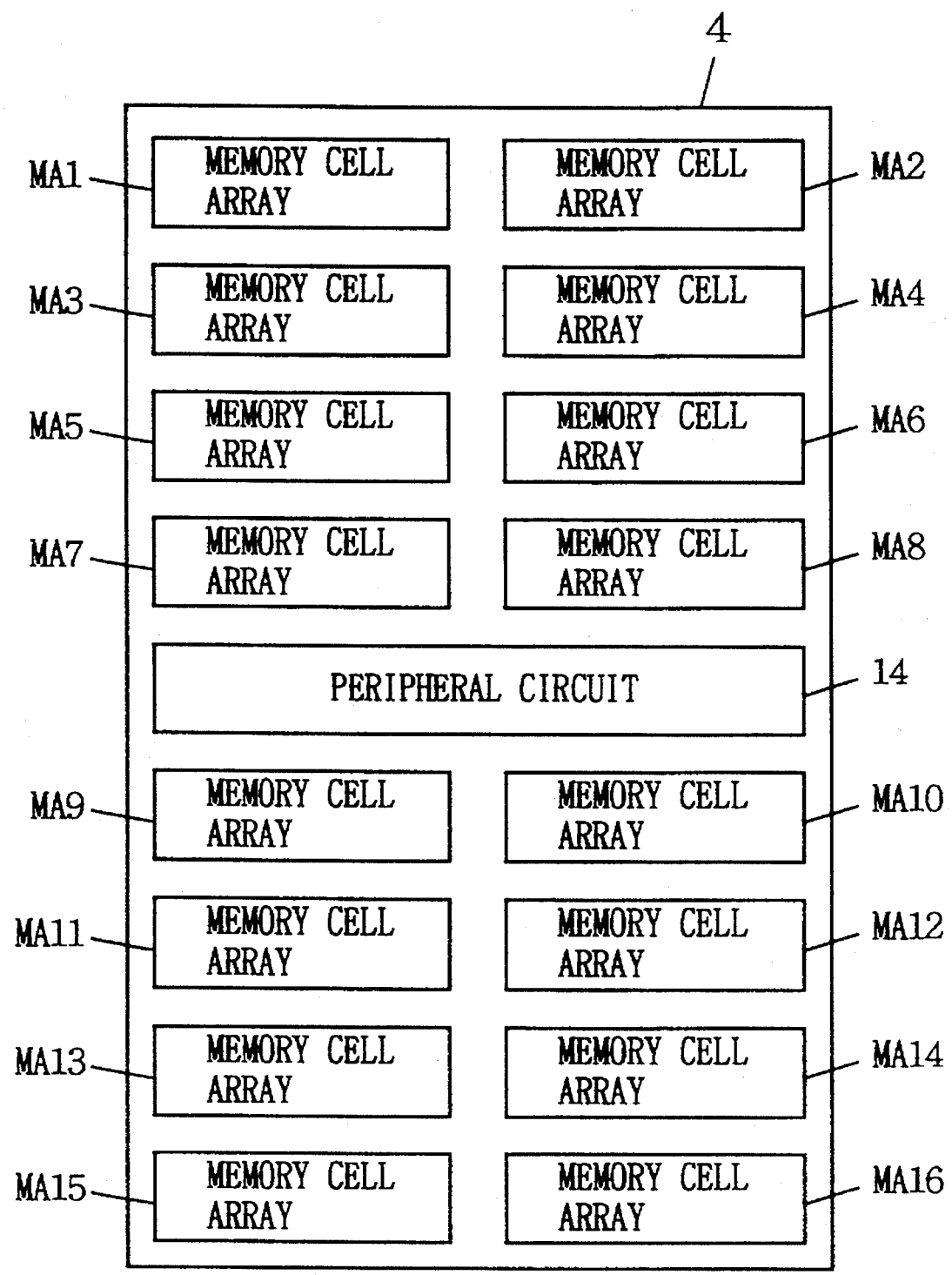
FIG. 2 shows a layout of the whole structure of the DRAM of the invention.

FIG. 2 shows a layout of a whole structure of a DRAM according to the embodiment 1 of the invention. Referring to FIG. 2, a DRAM 10 is provided with 16 memory cell arrays MA1–MA16, and a peripheral circuit 14 including a row decoder and a column decoder. Memory cell arrays MA1–MA16 and peripheral circuit 14 are formed on one semiconductor substrate 4.

Figure 3:
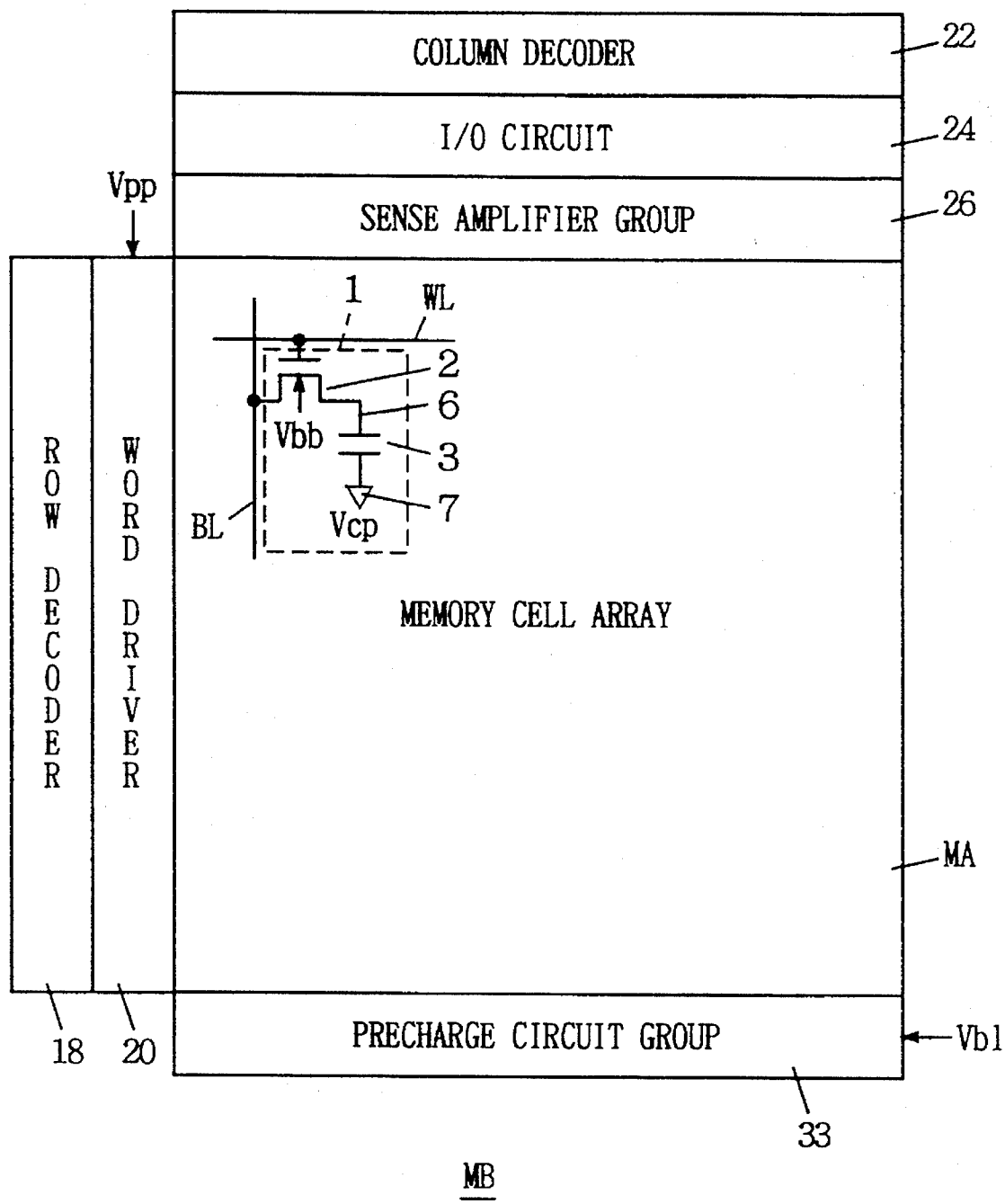
FIG. 3 is a block diagram showing a structure of each memory block in the DRAM of the invention.

As shown in FIG. 3, each memory cell array MA is coupled with a row decoder 18, a word driver 20, a column decoder 22, an I/O circuit 24, a sense amplifier group 26 and a precharge circuit group 33. These form one memory block MB as a whole.

Figure 4:
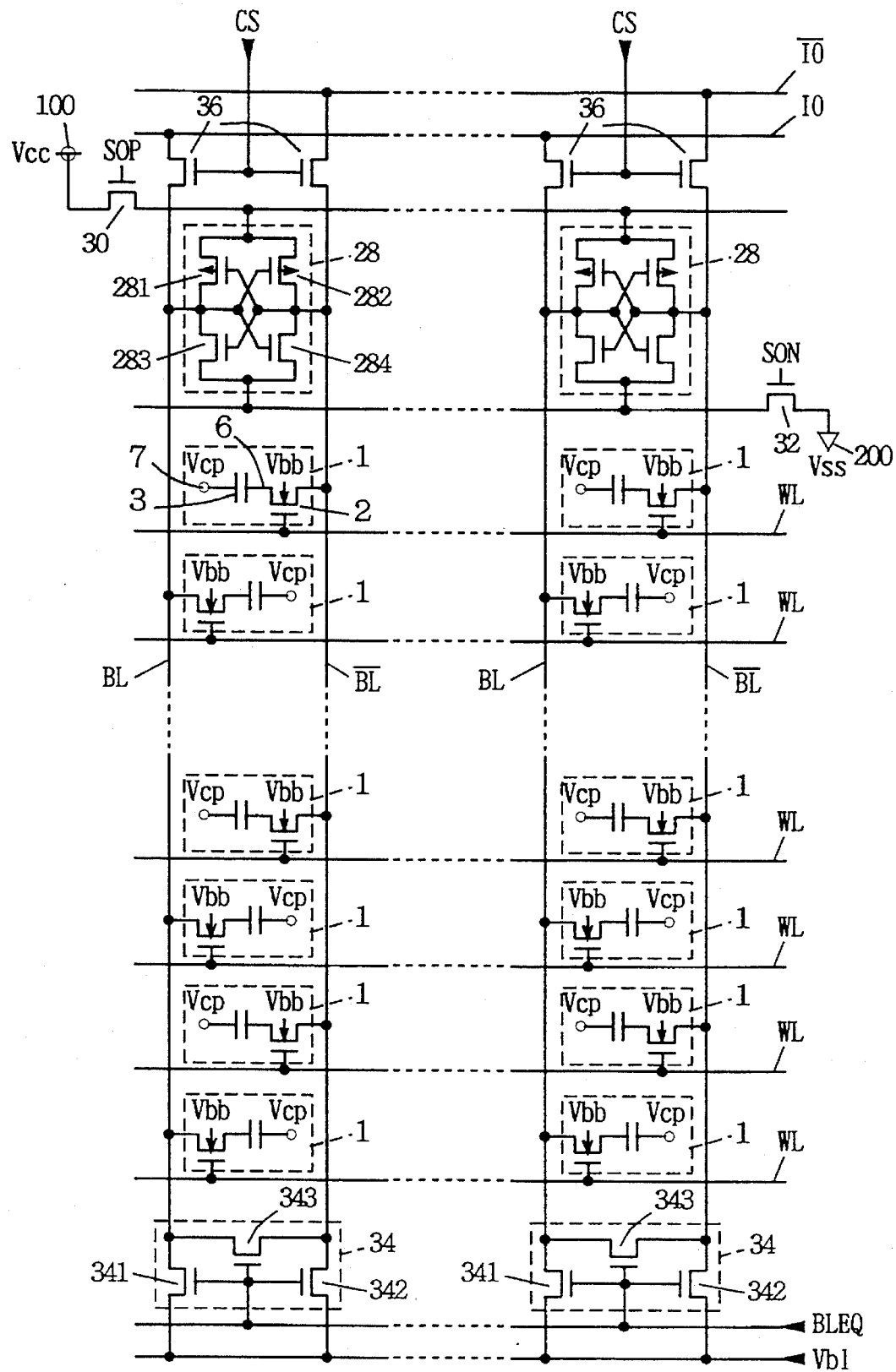
FIG. 4 is a circuit diagram showing a specific structure of a memory cell array, a sense amplifier group, an input/output circuit and a precharge circuit group.

FIG. 4 is a circuit diagram fragmentarily and specifically showing memory cell array MA, I/O circuit 24, sense amplifier group 26 and precharge circuit group 33. Referring to FIG. 4, memory cell array MA is provided with a plurality of word lines WL disposed in the column direction and a plurality of bit line pairs BL and /BL disposed in the row direction. A plurality of memory cells 1 are disposed at crossings between each word line WL and bit lines BL or /BL.

Each memory cell 1 includes a transfer gate 2 formed of an N-channel MOS transistor and a cell capacitor 3. One of source/drain electrodes of transfer gate 2 is connected to bit line BL or /BL. A gate electrode of transfer gate 2 is connected to word line WL. The other of source/drain electrodes is connected one of electrodes of cell capacitor 3. This one electrode forms a storage node 6. The other electrode of cell capacitor 3 forms a cell plate 7. Transfer gate 2 is supplied with substrate potential Vbb. Cell plate 7 is supplied with a cell plate potential Vcp.

One sense amplifier 28 is provided corresponding to each bit line pair BL and /BL. These plurality of sense amplifiers 28 form sense amplifier group 26 in FIG. 26. Each sense amplifier 28 includes P-channel MOS transistors 281 and 282 and N-channel MOS transistors 283 and 284. P-channel MOS transistors 281 and 282 form a P-channel sense amplifier. N-channel MOS transistors 283 and 284 form an N-channel sense amplifier. P-channel sense amplifier is connected via a drive transistor 30 formed of an N-channel MOS transistor to a power supply node 100 supplied with power supply potential Vcc. Drive transistor 30 is turned on in response to a drive signal SOP. The N-channel sense amplifier is connected via a drive transistor 32 formed of an N-channel MOS transistor to a ground node 200 supplied with ground potential Vss. Drive transistor 32 is turned on in response to a dive signal SON.

One precharge circuit 34 is provided for each bit line pair BL and /BL. Each precharge circuit 34 includes N-channel MOS transistors 341–343. These plurality of precharge circuits 34 form precharge circuit group 33 in FIG. 3.

Bit lines BL are connected to an I/O line IO via column select gates 36, respectively, and bit lines /BL are connected to an I/O line /IO via column select gates 36, respectively. Column select gate 36 is turned on in response to a column select signal CS sent from column decoder 22 in FIG. 3. Column select gates 36 and I/O lines IO and /IO form I/O circuit 24 in FIG. 3.

Referring to FIGS. 3 and 4, row decoder 18 decodes the received row address signal to select one of the plurality of word lines WL. Word driver 20 supplies boosted power supply potential Vpp to the selected word line WL. Boosted power supply potential Vpp is higher than normal power supply potential Vcc. When the potential of word line WL rises, all transfer gates 2 connected to this word line WL are turned on. Thereby, a minute potential difference occurs between the corresponding bit lines BL and /BL. Sense amplifier amplifies this potential difference.

Precharge circuit 34 supplies precharge potential Vbl to bit line pair BL and /BL before activation of sense amplifier 28. More specifically, when a bit line equalize signal BLEQ attains H-level, transistors 341–343 are turned on, so that precharge potential Vbl is supplied to bit lines BL and /BL via transistors 341 and 342, respectively. Since transistor 343 is also turned on, potentials of bit lines BL and /BL become equal to each other.

In this DRAM, as shown in FIG. 1, 16 N-wells 38 are formed on P-type semiconductor substrate 4, and P-wells 39 are formed in N-wells 38, respectively. Thus, semiconductor substrate 4 has triple wells structure.

Memory cell arrays MA1–MA16 are formed on P-wells 39, respectively. P$^+$-type contact regions 37 are formed in P-wells 39, respectively, and substrate potentials Vbb1–Vbb16 are supplied to contact regions 37, respectively.

The DRAM further includes substrate potential generating circuits 40 and 42. Substrate potential generating circuit 40 generates a deep substrate potential Vbbd for disturb. Substrate potential generating circuit 42 generates a shallow substrate potential Vbbs for pause. Both substrate potentials Vbbd and Vbbs are negative. Thus, substrate potential Vbbs is lower than ground potential Vss, and substrate potential Vbbd is lower than substrate potential Vbbs.

The DRAM further includes 16 switch circuits 44 provided correspondingly to memory cell arrays MA1–MA16. These switches 44 is responsive to block select signal BS1 to supply one of substrate potentials Vbbd and Vbbs to P-well 39 via contact region 37.

For example, memory cell array MA1 is activated in response to block select signal BS1. Upon activation of memory cell array MA1, deep substrate potential Vbbd is supplied as substrate potential Vbb1 to memory cell array MA1 via switch circuit 44. Memory cell arrays MA2–MA16 other than memory cell array MA1 are not activated, so that shallow substrate potential Vbbs is supplied as substrate potentials Vbb2–Vbb16 to memory cell arrays MA2–MA16 via switch circuits 44, respectively.

In FIG. 1, only memory cell array MA2 is activated, and other memory cell arrays MA1, MA3–MA16 are deactivated. Therefore, substrate potential Vbbd for disturb generated by substrate potential generating circuit 40 is supplied only to memory cell array MA2 via switch circuit 44. Meanwhile, substrate potential Vbbs for pause generated by substrate potential generating circuit 42 is supplied to memory cell arrays MA1, MA3–MA16 via switch circuits 44.

Therefore, all memory cells 1 in activated memory cell array MA2 are supplied on their transfer gates 2 with deep substrate potential Vbbd. Therefore, the threshold voltage of these transfer gates 2 is increased by the substrate effect to a value higher than the threshold voltage of transfer gates 2 in the other memory cell arrays MA1, MA3–MA16. This results in reduction of the leak current which may be caused by subthreshold current Isth shown in FIG. 27. Therefore, a data holding time period of memory cell 1 increases.

Figure 27:
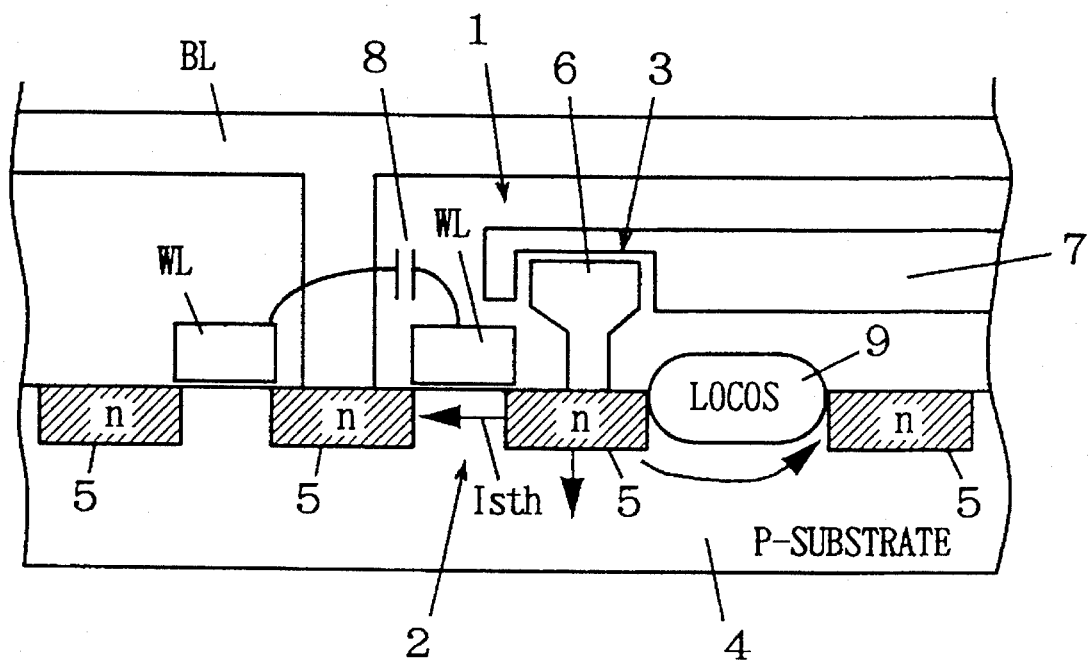
FIG. 27 is a cross section showing a structure of a memory cell in a DRAM.
Figure 28:
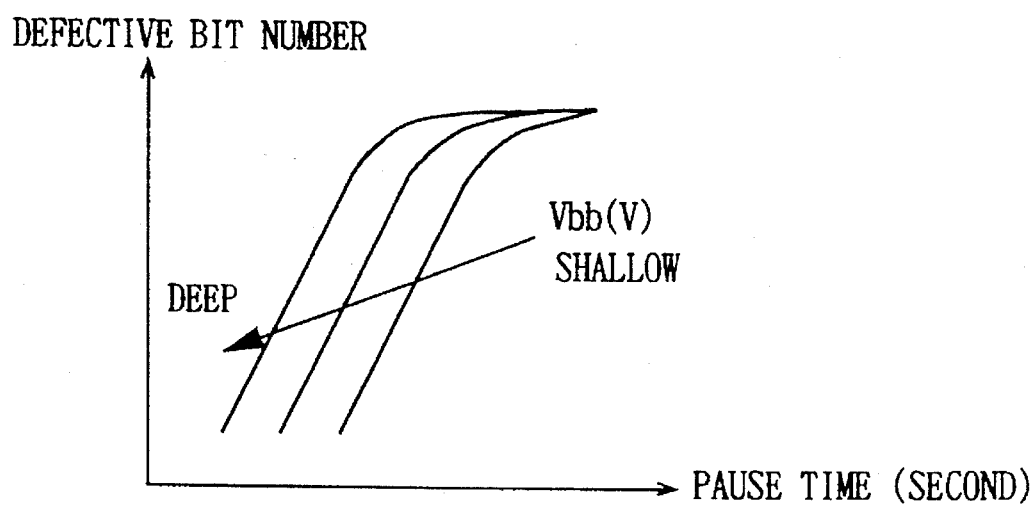
FIG. 28 is a graph showing a relationship between a pause time and a number of defective bits.

Shallow substrate potential Vbbs is supplied to transfer gates 2 of all memory cells 1 in memory cell arrays MA1, MA3–MA16. In each of these memory cell 1, therefore, this reduces a voltage applied to the depletion layer which is formed around source/drain regions 5 as shown in FIG. 27. Accordingly, it is possible to reduce the leak current flowing from storage node 6 via source/drain regions 5 located thereunder to semiconductor substrate 4. Also, it is possible to reduce the leak current flowing from storage node 6 via source/drain regions 5 located thereunder and semiconductor substrate 4 located under element isolating oxide film 9 to a neighboring memory cell.

Figure 5:
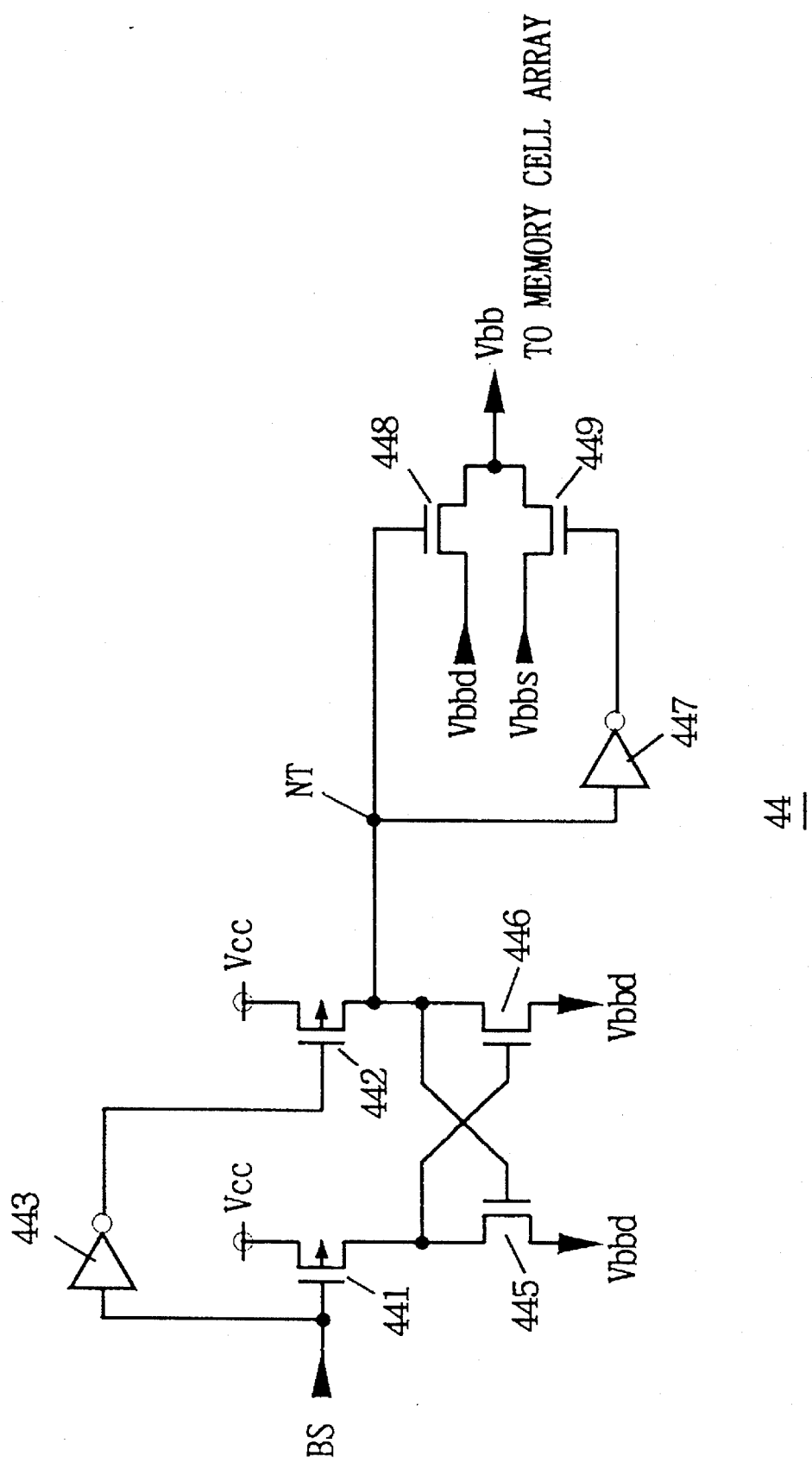
FIG. 5 is a circuit diagram showing a specific structure of each switch circuit shown in FIG. 1.

FIG. 5 is a circuit diagram showing an example of switch circuit 44 in FIG. 1. Referring to FIG. 5, switch circuit 44 includes a P-channel MOS transistor 441 directly receiving block select signal BS and a P-channel MOS transistor 442 receiving block select signal BS via an inverter 443. Switch circuit 44 further includes an N-channel MOS transistor 445 connected in series to transistor 441 and an N-channel MOS transistor 446 connected in series to transistor 442. A gate electrode of transistor 445 is connected to a drain electrode of transistor 446, and a gate electrode of transistor 446 is connected to a drain electrode of transistor 445. Both source electrodes of transistors 445 and 446 are supplied with deep substrate potential Vbbd.

Switch circuit 44 further includes an inverter 447 and N-channel MOS transistors 448 and 449. A drain electrode of transistor 442 is connected to a gate electrode of transistor 448, and is connected to a gate electrode of transistor 449 via inverter 447.

Figure 6:
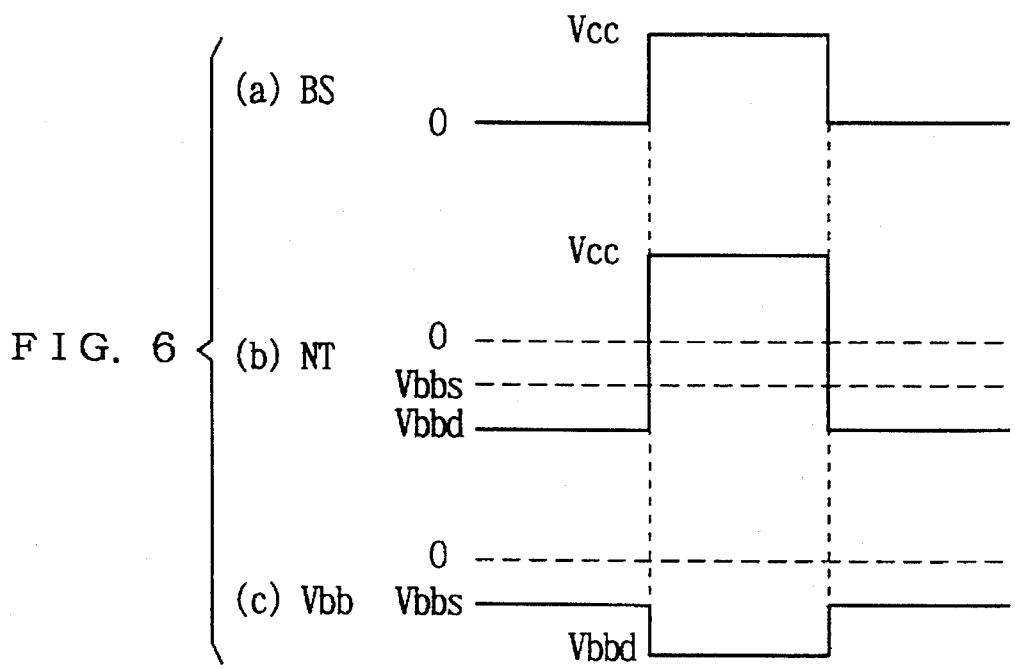
FIG. 6(a)–(c) is a timing chart showing operation of a switch circuit shown in FIG. 5.

FIG. 6 is a timing chart showing operation of switch circuit 44 shown in FIG. 5. As shown at (a) in FIG. 6, when block select signal BS is at L-level corresponding to ground potential Vss, transistor 441 is turned on, and transistor 442 is turned off. Transistor 445 is turned off, and transistor 446 is turned on. Therefore, the potential of a node NT attains deep substrate potential Vbbd as shown at (b) in FIG. 6. Thereby, transistor 448 is turned off, and transistor 449 is turned on. Therefore, shallow substrate potential Vbbs is supplied as substrate potential Vbb to the corresponding memory cell array via transistor 449 as shown at (c) in FIG. 6.

As shown at (a) in FIG. 6, when block select signal BS is at H-level corresponding to power supply potential Vcc, transistor 441 is turned off, and transistor 442 is turned on. Transistor 445 is turned on, and transistor 446 is turned off. Therefore, the potential of node NT attains power supply potential Vcc as shown at (b) in FIG. 6. Thereby, transistor 448 is turned on, and transistor 449 is turned off. Therefore, deep substrate potential Vbbd is supplied as substrate potential Vbb to the corresponding memory cell array via transistor 448 as shown at (c) in FIG. 6.

As described above, switch circuit 44 supplies shallow substrate potential Vbbs for pause when block select signal BS is at L-level, and supplies deep substrate potential Vbbd for disturb when block select signal BS is at H-level.

Figure 7:
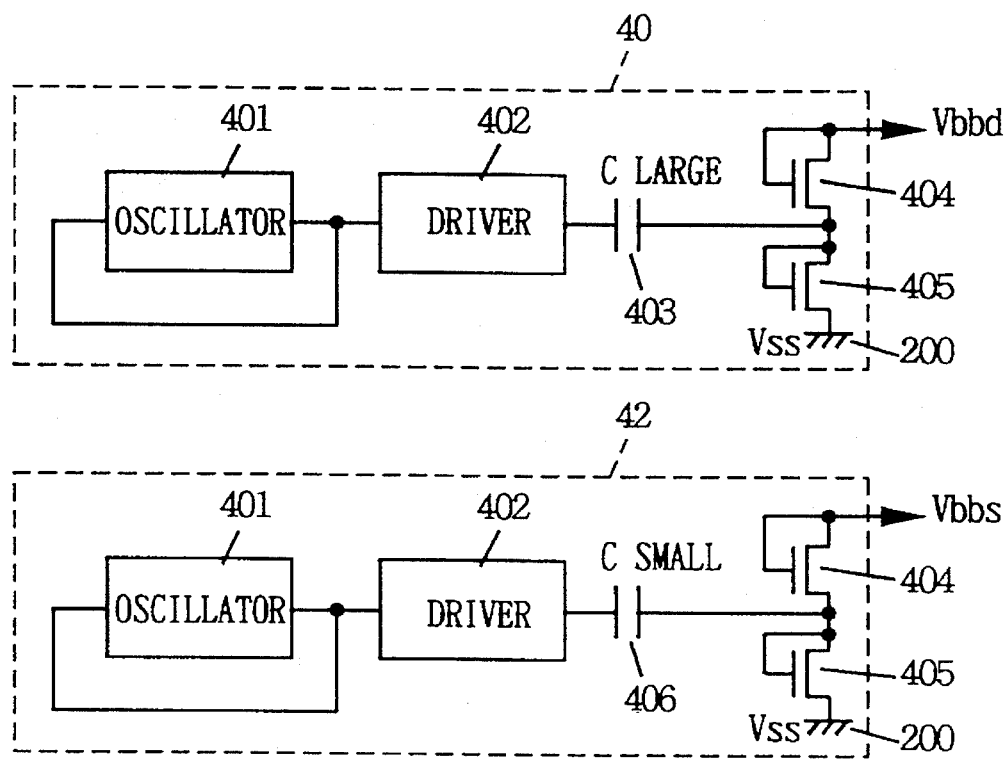
FIG. 7 is a block diagram showing specific structures of two substrate potential generating circuits shown in FIG. 1.

FIG. 7 is a block diagram showing specific structures of substrate potential generating circuits 40 and 42 shown in FIG. 1. Referring to FIG. 7, substrate potential generating circuit 40 includes an oscillator 401, a driver 402, a capacitor 403 and diode-coupled N-channel MOS transistors 404 and 405. Oscillator 401 includes an odd number of inverters (not shown) coupled in a ring form. Driver 402 drives capacitor 403 in response to the output of oscillator 401. Capacitor 403 and transistors 404 and 405 form a charge pump circuit.

Substrate potential generating circuit 42 includes oscillator 401, driver 402, a capacitor 406 and transistors 404 and 405. Substrate potential generating circuit 42 differs from substrate potential generating circuit 40 in that the capacity of capacitor 406 is smaller than that of capacitor 403.

Therefore, substrate potential generating circuit 40 can pump a larger amount of electric charges than substrate potential generating circuit 42, so that substrate potential Vbbd generated by substrate potential generating circuit 40 is lower than substrate potential Vbbs generated by substrate potential generating circuit 42.

According to the embodiment 1, deep substrate potential Vbbd is supplied only to one active memory cell array, and shallow substrate potential Vbbs is supplied to all the other inactive memory cell arrays, so that both problems relating to disturb refresh and pause refresh can be overcome. Since shallow substrate potential Vbbs is supplied to the inactive memory cell arrays, the power consumption can be smaller than that in the case where the same substrate potential is supplied to all the memory cell arrays.

Figure 8:
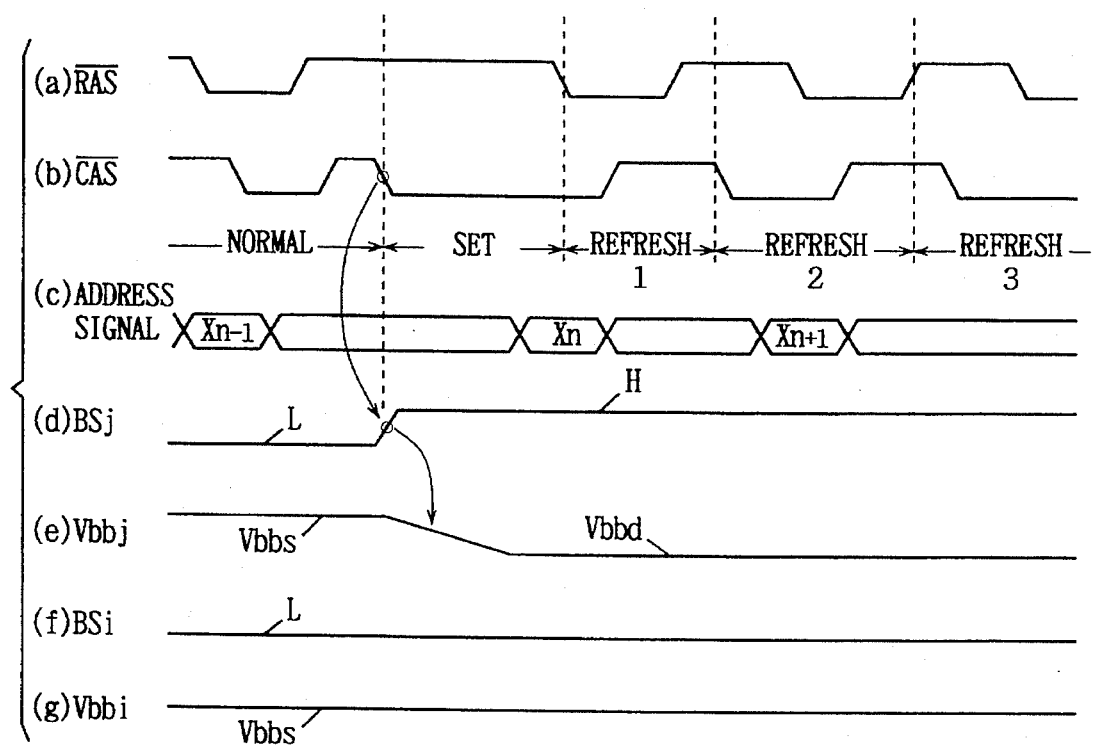
FIG. 8(a)–(g) is a timing chart showing a CBR refresh cycle in the DRAM shown in FIG. 1.

A refresh method in this DRAM will be described below. FIG. 8 is a timing chart showing a CBR (/CAS before /RAS) refresh cycle in the DRAM. Referring to FIG. 8, when a column address strobe signal /CAS rises prior to rising of row address strobe signal /RAS, the normal cycle terminates, and the refresh cycle starts.

Figure 29:
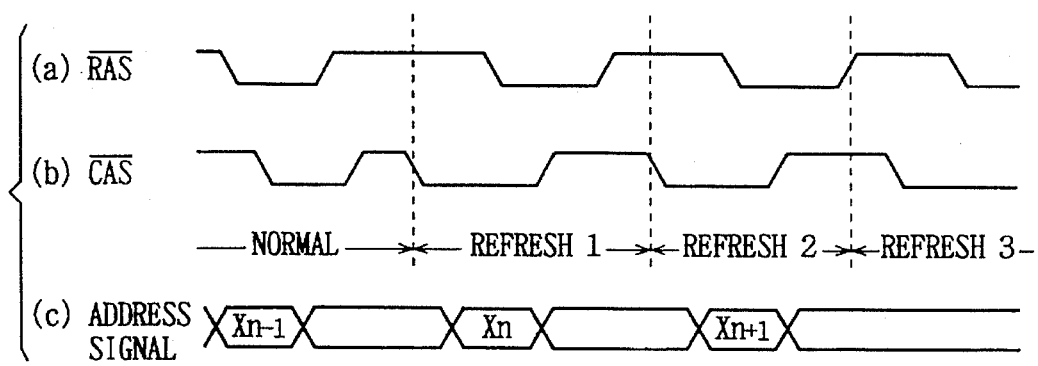

Although the conventional CBR refresh cycle is performed such that the refresh cycle starts immediately after termination of the normal cycle as shown in FIG. 29, the CBR refresh cycle shown in FIG. 8 is performed such that the refresh cycle does not start immediately after termination of the normal cycle. More specifically, a set cycle is interposed between termination of the normal cycle and subsequent start of the refresh cycle.

In this set cycle, when column address strobe signal /CAS falls as shown at (b) in FIG. 8, block select signal BSj supplied to the memory block rises from L-level to H-level as shown at (d) in FIG. 8. While block select signal BSj is at L-level, the corresponding memory block is supplied with shallow substrate potential Vbbs for pause as shown at (e) in FIG. 8. When block select signal BSj attains H-level, the memory block is supplied with deep substrate potential Vbbd for disturb. In the CBR refresh cycle shown in FIG. 8, since there is provided the set cycle, pumping of electric charges of corresponding P-well 39 is performed during the set cycle, so that potential Vbbj of P-well 39 sufficiently lowers from Vbbs to Vbbd as shown at (e) in FIG. 8. After potential Vbbj of P-well 39 completely lowers to Vbbd, the refresh is performed.

Meanwhile, in the unselected memory blocks, block select signal (BSi) at L-level is continuously supplied as shown at (f) in FIG. 8, so that potentials Vbbi of P-wells 39 in the unselected memory blocks do not change and are maintained at Vbbs as shown at (g) in FIG. 8.

Figure 9:
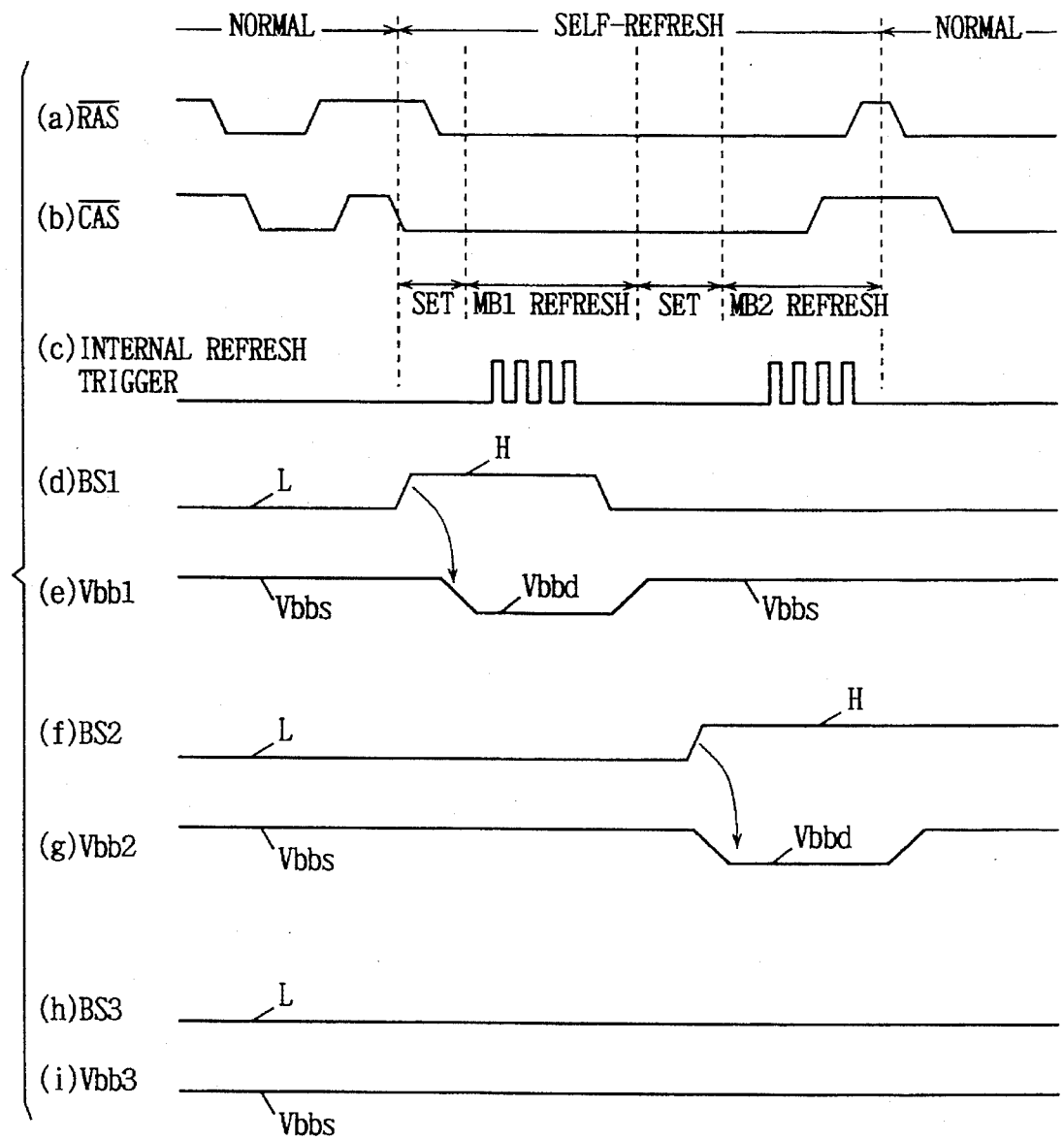
FIG. 9(a)–(i) is a timing chart showing a CBR self-refresh cycle in the DRAM shown in FIG. 1.

A self-refresh method will be described below. FIG. 9 is a timing chart showing operation of CBR self-refresh in the DRAM. As shown at (a) and (b) in FIG. 9, when column address strobe signal /CAS rises prior to rising of row address strobe signal /RAS, the normal cycle terminates, and the self-refresh cycle starts. In the self-refresh cycle, internal refresh triggers are successively produced after elapsing of a certain time from rising of row address strobe signal /RAS as shown at (c) in FIG. 9. In response to the internal refresh triggers, internal address signals are successively produced, and the memory cells corresponding to the internal address signals thus produced are automatically refreshed.

Figure 30:
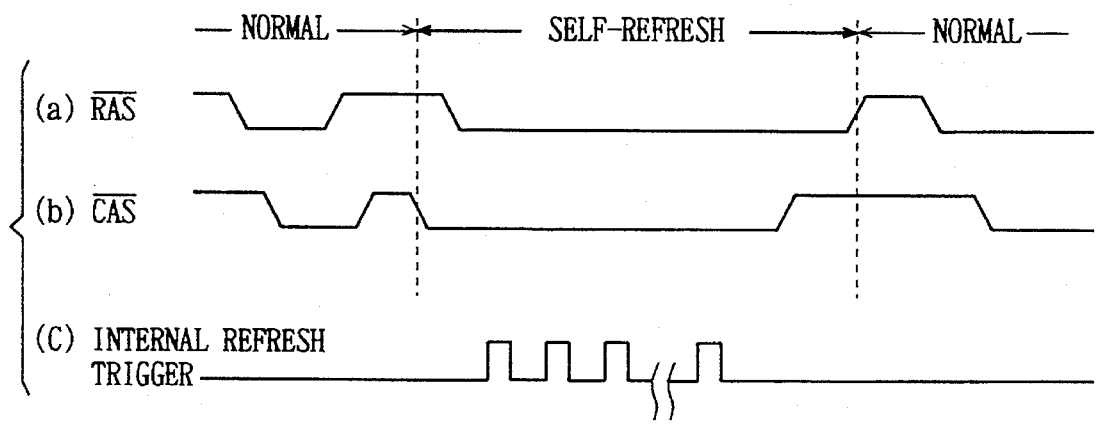

In the conventional CBR self-refresh, as shown in FIG. 30, the internal refresh trigger is produced immediately after elapsing of a certain time after rising of row address strobe signal /RAS as shown in FIG. 30. However, in the CBR refresh cycle shown in FIG. 9, the set cycle is provided before start of the refresh cycle of each memory block. In the initial set cycle, block select signal BS1 rises from L-level to H-level as shown at (d) in FIG. 9, whereby substrate potential Vbb1 of P-well 39 in selected memory block MB1 lowers from Vbbs to Vbbd as shown at (e) in FIG. 9. After substrate potential Vbb1 sufficiently lowers to deep substrate potential Vbbd for disturb as described above, the internal refresh trigger is produced as shown at (c) in FIG. 9. The internal addresses are successively produced in response to the internal refresh triggers, whereby memory block MB1 is refreshed. When block select signal BS1 rises, substrate potential Vbb1 returns to shallow substrate potential Vbbs for pause.

When block select signal BS2 rises at the subsequent set cycle as shown at (f) in FIG. 9, substrate potential Vbb2 in the selected memory block sufficiently lowers from Vbbs to Vbbd as shown at (g) in FIG. 9. After substrate potential Vbb2 sufficiently lowers to deep substrate potential Vbbd for disturb, the internal refresh trigger is produced as shown at (c) in FIG. 9. In response to this internal refresh trigger, internal addresses are successively produced, whereby memory block MB2 is refreshed.

During this self-refresh, block select signal BS3 supplied to unselected memory block MB3 does not change and maintains the L-level as shown at (h) in FIG. 9, so that substrate potential Vbb3 in unselected memory block MB3 does not change and maintains a level equal to substrate potential Vbbs for pause as shown at (i) in FIG. 9.

In the self-refresh, the set cycle is necessarily provided before the refresh cycle of each memory block as described above, so that substrate potential Vbb lowers to deep substrate potential Vbbd for disturb during the set cycle.

In this embodiment 1, P-type semiconductor substrate 4 is provided with the triple wells. Alternatively, a predetermined number of P-wells may be formed on an N-type semiconductor substrate, and memory cell arrays may be formed on these P-wells.

[Embodiment 2]

Figure 10:
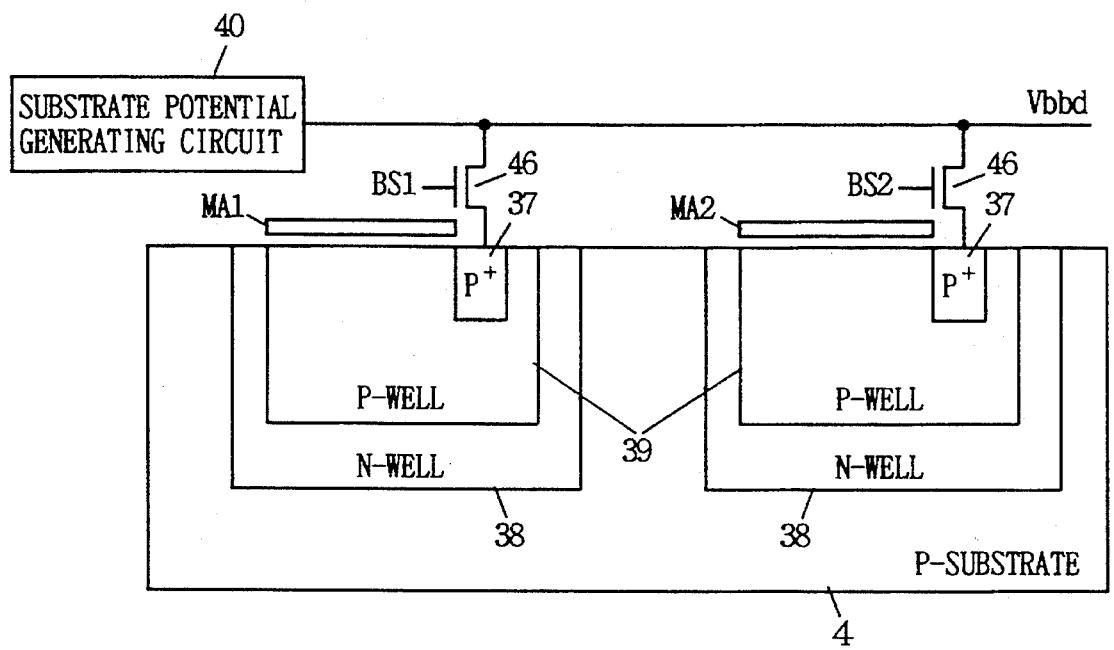
FIG. 10 conceptually shows a structure of a DRAM according to an embodiment 2 of the invention.
Figure 11:
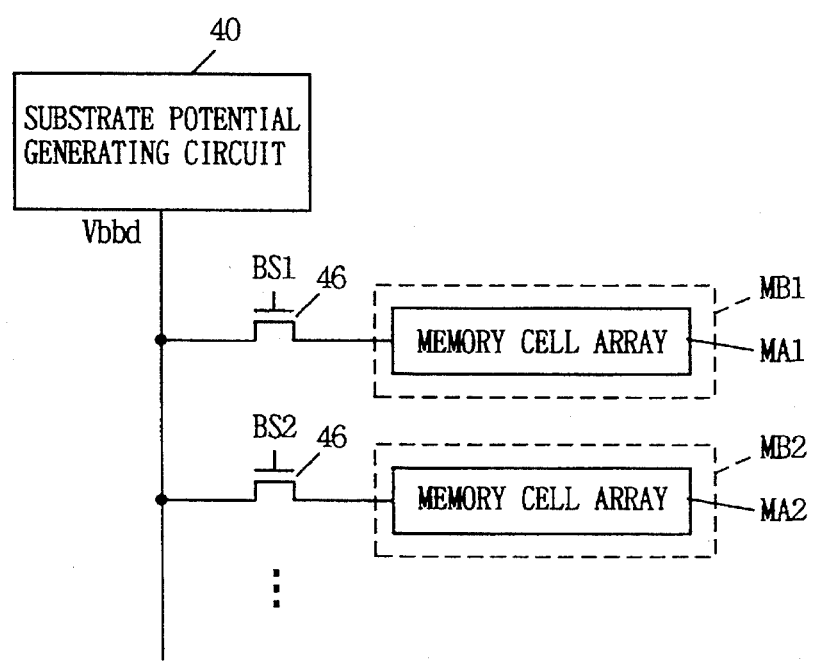
FIG. 11 is a block diagram showing the structure of the DRAM shown in FIG. 10.

FIG. 10 conceptually shows a structure of a DRAM according to the embodiment 2 of the invention. FIG. 11 is a block diagram of the DRAM shown in FIG. 10. Referring to FIGS. 10 and 11, the embodiment 2 is provided with only one substrate potential generating circuit 40. It is not provided with substrate potential generating circuit 42 in the embodiment 1. Substrate potential generating circuit 40 is connected to memory cell arrays MA1, MA2, . . . in 16 memory blocks MB1, MB2, . . . via 16 select transistors 46, respectively. In FIGS. 10 and 11, memory blocks MB3–MB16 are not shown.

In this DRAM, when block select signal (e.g., signal BS1) attains H-level, memory block MB1 including memory cell array MA1 is activated. Since other block select signals BS2–BS16 are at L-level, other memory blocks MB2–MB16 MB16 are not activated. When block select signal BS1 attains H-level, corresponding select transistor 46 is turned on, so that deep substrate potential Vbbd for disturb produced by substrate potential generating circuit 40 is supplied via select transistor 46 to P-well 39 at which memory cell array MA1 is formed. Since other block select signals BS2–BS16 are at L-level, all corresponding select transistors 46 are off. Therefore, P-wells 39 at which memory cell arrays MA2–MA16 are formed are electrically floated. The CBR refresh and CBR self-refresh are performed in the same manner as that in the embodiment 1.

As is done in this embodiment 2, deep substrate potential Vbbd for disturb may be supplied only to the memory cell array in the selected memory block. Since the embodiment 2 is provided with only one substrate potential generating circuit, i.e., circuit 40, the layout area is smaller than that of the embodiment 1.

[Embodiment 3]

Figure 12:
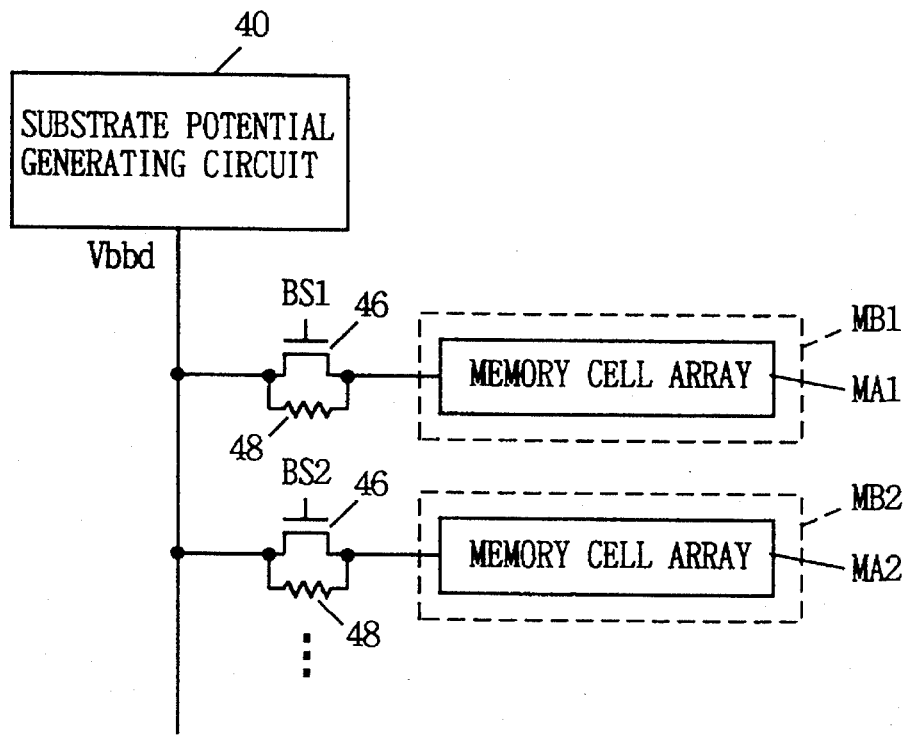
FIG. 12 is a block diagram showing a structure of a DRAM according to an embodiment 3 of the invention.

FIG. 12 is a block diagram showing a structure of a DRAM according to the embodiment 3 of the invention. Referring to FIG. 12, the embodiment 3 includes resistances 48 connected in parallel to select transistors 46, respectively, in addition to the structures of the embodiment 2. Resistances 48 have a high value.

In this embodiment 3, when memory block (e.g., MB1) is selected, deep substrate potential Vbbd for disturb is supplied to memory cell array MA1 via corresponding select transistor 46. Substrate potential Vbbd is supplied to memory cell arrays MA2–MA16 of unselected memory blocks MB2–MB16 via resistances 48. Since resistances have a high value, substrate potential Vbbd is slightly supplied to unselected memory blocks MB2–MB16, but they can be supplied with a current enough to ensure the potential of wells at which these memory cell arrays MA2–MA16 are formed. The CBR refresh and CBR self-refresh are performed similarly to the embodiment 1.

According to this embodiment 3, since deep substrate potential Vbbd is strongly supplied only to the selected memory block, the power consumption can be smaller than that in the case where deep substrate potential Vbbd is strongly supplied to all the memory blocks. Since there is provided only one substrate potential generating circuit 40, the layout area can be smaller than that in the embodiment 1. Since the unselected memory blocks are slightly supplied with substrate potential Vbbd via resistances 48, the minimum operation of the memory cell arrays is ensured.

[Embodiment 4]

Figure 13:
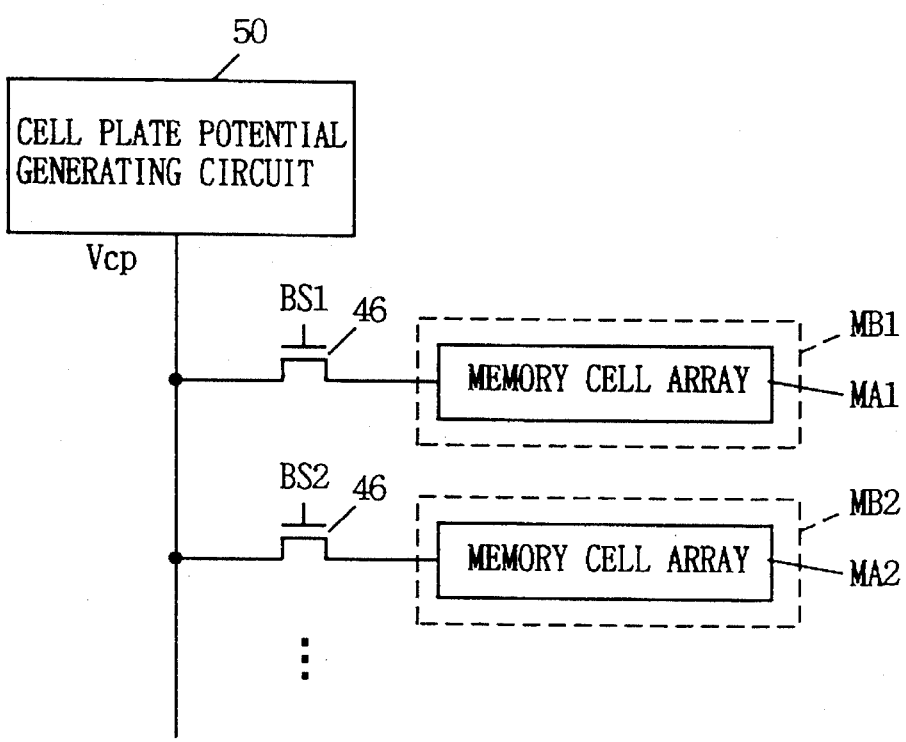
FIG. 13 is a block diagram showing a structure of a DRAM according to an embodiment 4 of the invention.

FIG. 13 is a block diagram showing a structure according to the embodiment 4 of the invention. In this embodiment 4, the memory cell array of only the selected one memory block is supplied with cell plate potential Vcp produced by a cell plate potential generating circuit 50, and the memory cells in the other memory blocks are not supplied with the cell plate potential Vcp. The cell plate potential Vcp is supplied to cell plate 7 of cell capacitor 3 in memory cell 1 as shown in FIG. 4. In this embodiment 4, potential of Vcc/2 which is half the power supply potential is supplied as cell plate potential Vcp.

Figure 14:
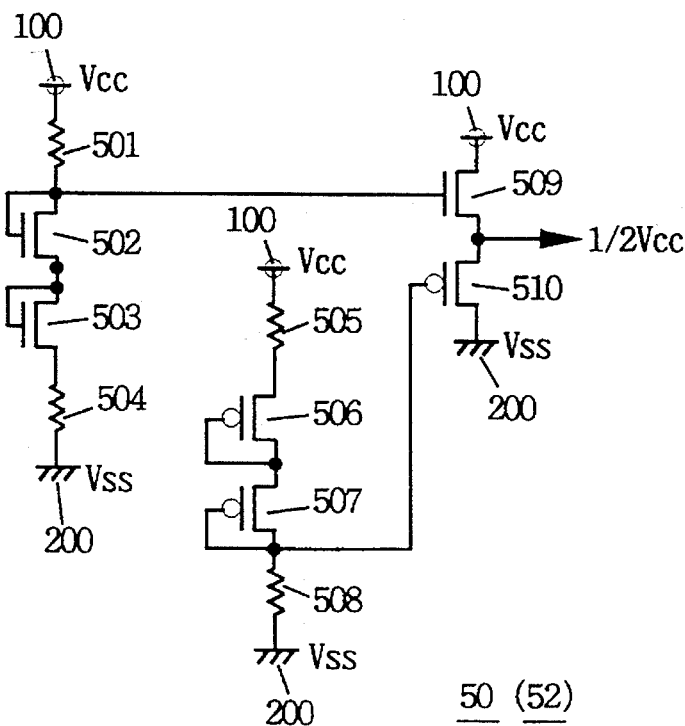
FIG. 14 is a circuit diagram showing a structure of an intermediate potential generating circuit for generating a cell plate potential or a precharge potential.

FIG. 14 is a circuit diagram showing a structure of an intermediate potential generating circuit forming the cell plate potential generating circuit 50. Referring to FIG. 14, the intermediate potential generating circuit includes resistances 501 and 504 as well as N-channel MOS transistors 502 and 503 which are connected in series between power supply node 100 and ground node 200. Transistors 502 and 503 each are diode-coupled. Transistor 502 produces at its drain electrode a potential higher than intermediate potential Vcc/2 by a threshold voltage of transistor 502.

Resistances 505 and 508 as well as P-channel MOS transistors 506 and 507 are connected in series between power supply node 100 and ground node 200. Transistors 506 and 507 each are diode-coupled. Transistor 507 produces at its drain electrode a potential lower than intermediate potential Vcc/2 by a threshold voltage of transistor 507.

An N-channel MOS transistor 509 and a P-channel MOS transistor 510 are connected in series between power supply node 100 and ground node 200. Transistor 509 is supplied on its gate electrode with a source potential of transistor 502 described above. Transistor 510 is supplied on its gate electrode with a source potential of transistor 507 described above. Therefore, intermediate potential Vcc/2 is produced at the common drain electrode of transistors 509 and 510. Intermediate potential Vcc/2 is supplied as cell plate potential Vcp only to the selected memory cell array.

According to the embodiment 4, since cell plate potential Vcp is supplied only to the selected memory cell array, it is possible to reduce the size of transistors 509 and 510 at the output stage of the intermediate potential generating circuit forming cell plate potential generating circuit 50. Therefore, the power consumption of intermediate potential generating circuit is reduced. Even in the case where a leak current occurs at cell plate 7 due to defect in memory cell array 1, the intermediate potential generating circuit is not affected by the leak current if the memory cell array containing the defective memory cell can be replaced with a spare memory cell array.

[Embodiment 5]

Figure 15:
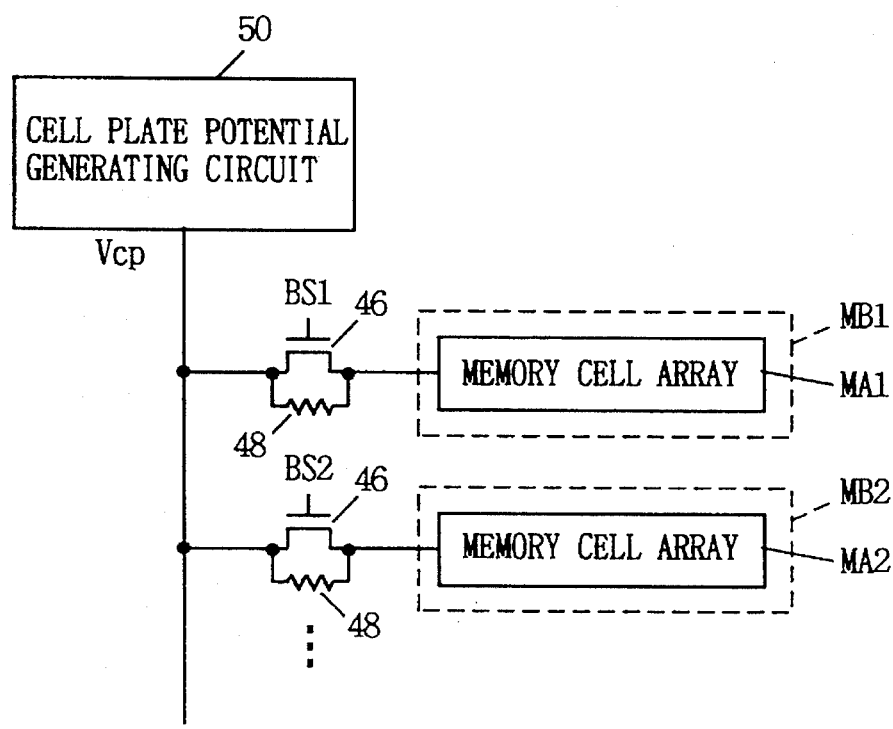
FIGS. 15 to 18 are block diagrams showing structures of DRAMs according to embodiments 5 to 8 of the invention, respectively.

FIG. 15 is a block diagram showing a structure of a DRAM according to the embodiment 5 of the invention. Referring to FIG. 15, the embodiment 5 includes resistances 48 of a large value connected to select transistors 46, respectively, in addition to the structure of the embodiment 5.

In the embodiment 5, cell plate potential Vcp is strongly supplied only to the memory cell array in the selected memory block, and cell plate potential Vcp is slightly supplied to the memory cell arrays in the unselected memory blocks via resistances 48.

According to this embodiment 5, since the size of transistors 509 and 510 at the output stage of cell plate potential generating circuit 50 can be reduced similarly to the embodiment 4, the power consumption can be reduced. Since a slight amount of cell plate potential Vcp is supplied to the unselected memory cell arrays via resistances 48, the cell plate potential in the unselected memory cell arrays is ensured to some extent.

[Embodiment 6]

Figure 16:
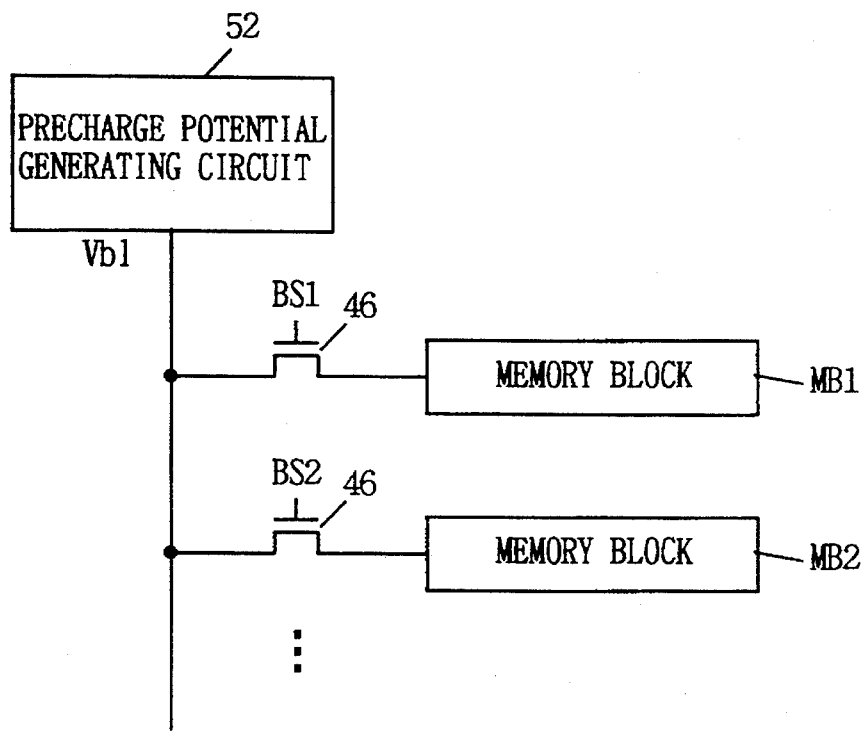

FIG. 16 is a block diagram showing a structure of a DRAM according to the embodiment 6 of the invention. In the embodiment 6 shown in FIG. 6, only the selected one memory block is supplied with precharge potential Vbl produced by a precharge potential generating circuit 52 via select transistor 46. Precharge potential Vbl is supplied to precharge circuit 34 in FIG. 4. Since precharge potential Vbl is not supplied to unselected memory blocks, the unselected memory blocks are electrically floated.

In this embodiment 6, potential of Vcc/2 which is half the power supply potential is supplied as precharge potential Vbl. Therefore, the specific structure of precharge potential generating circuit 52 is the same as the intermediate potential generating circuit shown in FIG. 14.

According to the embodiment 6, since precharge potential Vbl is not supplied to the unselected memory blocks, the whole power consumption of DRAM can be reduced. Since it is possible to reduce the size of transistors 509 and 510 at the output stage of the intermediate potential generating circuit forming precharge potential generating circuit 52, the power consumption of the intermediate potential generating circuit can also be reduced.

[Embodiment 7]

Figure 17:
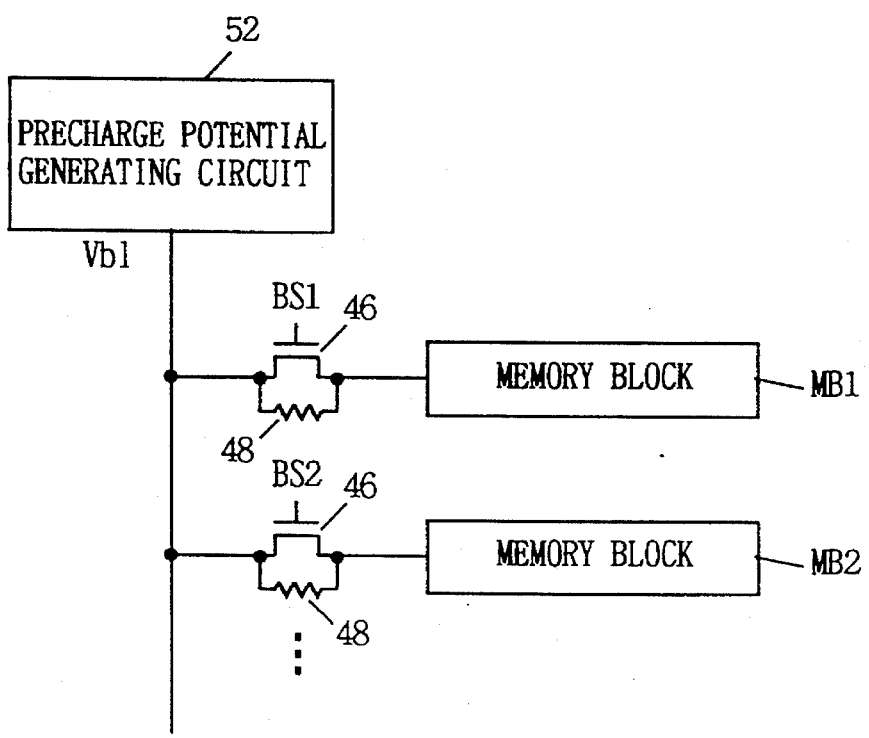

FIG. 17 is a block diagram showing a structure of a DRAM according to the embodiment 7 of the invention. Referring to FIG. 17, the embodiment 7 includes resistances 48 of a high value connected in parallel to select transistors 46, respectively, in addition to the structure of the embodiment 6. Therefore, precharge potential Vbl is slightly supplied to the unselected memory blocks via resistances 48. Thereby, the unselected memory blocks are not floated, and precharge potential Vbl is ensured to some extent.

[Embodiment 8]

Figure 18:
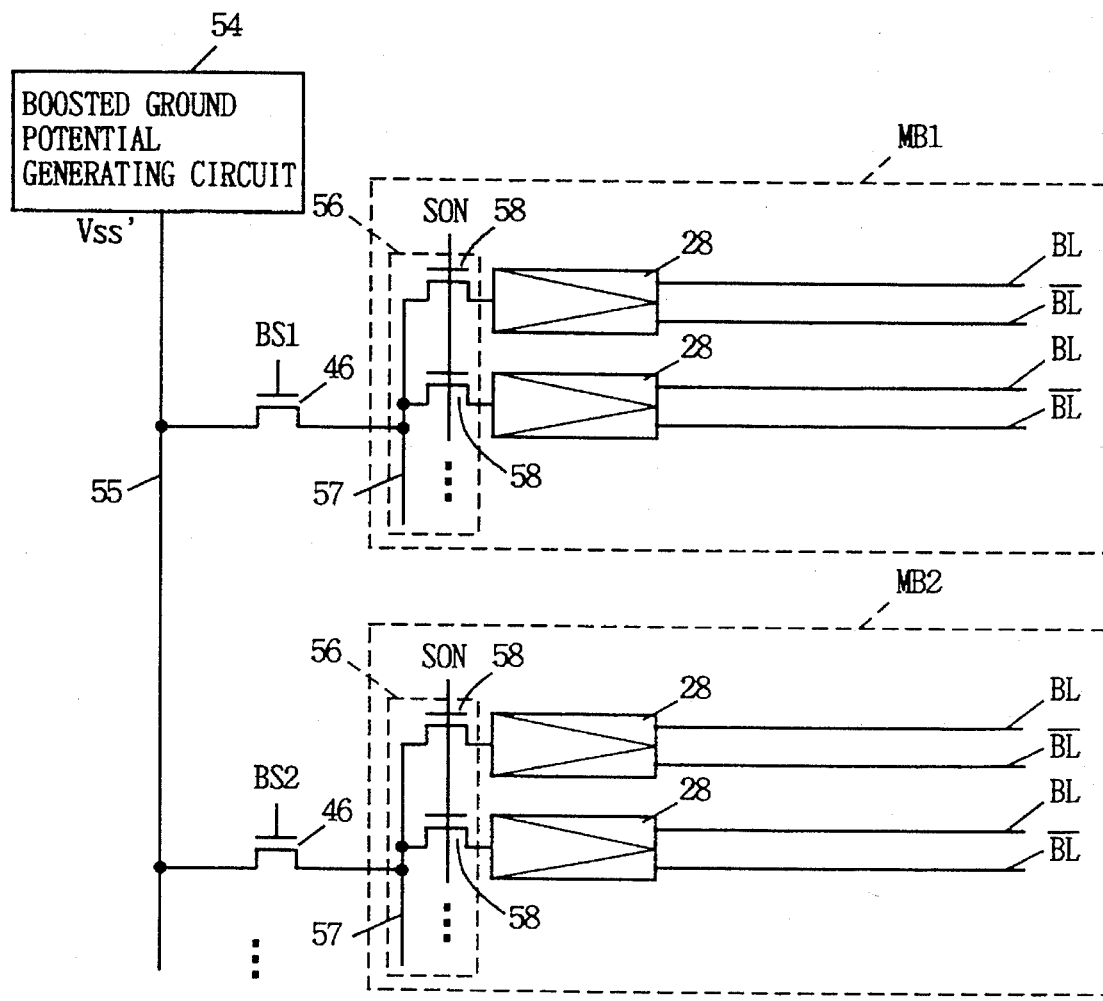

FIG. 18 is a block diagram showing a structure of a DRAM according to the embodiment 8 of the invention. Referring to FIG. 18, the plurality of sense amplifiers 28 are connected to one segment boosted ground line 57 via a plurality of drive transistors 58, respectively. These plurality of segment boosted ground lines 57 are connected to one global boosted ground line 55 via select transistors 46. Global boosted ground line 55 is supplied with a boosted ground potential Vss' produced by a boosted ground potential generating circuit 54. Each sense amplifier 28 is connected also to the power supply node via a drive transistor (not shown).

The plurality of drive transistors 58 in each memory block form one sense amplifier drive circuit 56. The drive circuit 56 supplies boosted ground potential Vss' to the plurality of sense amplifiers 28. More specifically, drive transistor 58 is turned on in response to drive signal SON, so that the potential of segment boosted ground line 57 is supplied to sense amplifier 28.

As described above, the embodiment 8 employs the voltage-boosted sense ground method described before, and also employs such a structure that the boosted ground line is hierarchized into global boosted ground line 55 and segment boosted ground line 57.

Figure 19:
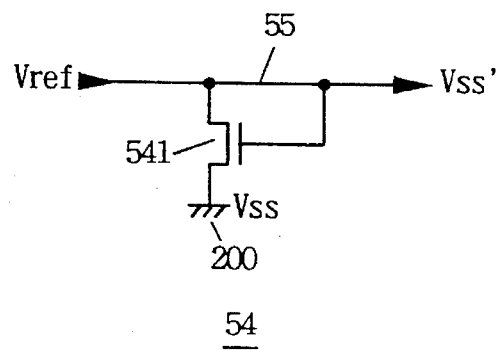
FIG. 19 is a circuit diagram showing a specific structure of a boosted ground potential generating circuit shown in FIG. 18.

FIG. 19 is a circuit diagram showing an example of boosted ground potential generating circuit 54 shown in FIG. 18. Referring to FIG. 19, boosted ground potential generating circuit 54 is formed of a diode-coupled N-channel MOS transistor 541. Transistor 541 is connected between global boosted ground line 55 and ground node 200. Global boosted ground line 55 is supplied with an internally produced reference potential Vref. According to boosted ground potential generating circuit 54, a potential which is higher than ground potential Vss by the threshold voltage of transistor 541 is produced as boosted ground potential Vss' on global boosted ground line 55.

According to this embodiment 8, boosted ground potential generating circuit 54 produces and supplies high boosted ground potential Vss' higher than normal ground potential Vss to global boosted ground line 55. When one of the block select signals attains H-level, the corresponding memory block is activated, and corresponding select transistor 46 is turned on. Thereby, potential Vss' on global boosted ground line 55 is supplied to one boosted ground line 57. Boosted ground potential Vss' is not supplied to segment boosted ground lines 57 in the unselected memory blocks. Therefore, segment boosted ground lines 57 in the unselected memory blocks are electrically floated.

Figure 20:
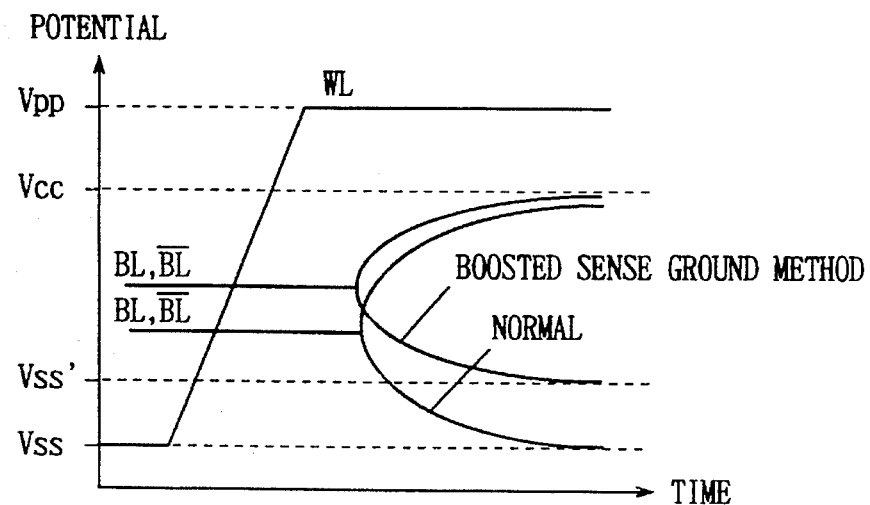
FIG. 20 is a graph showing potential change of a bit line in the DRAM shown in FIG. 18.

Referring to FIGS. 18 and 20, all bit line pairs BL and /BL are precharged to a predetermined precharge potential Vcp (here, Vcc/2) in the selected memory block. When the potential of one word line WL rises, data is read from all memory cells 1 connected to this word line onto bit line pairs BL and /BL. Thereby, a potential difference occurs between bit lines BL and /BL. Subsequently, drive signal SL0 attains H-level to turn on drive transistor 58. Thereby, boosted ground potential Vss' on segment boosted ground line 57 is supplied to sense amplifier 28, and the potential of one of bit lines BL and /BL in each pair lowers to ground potential Vss'. Since sense amplifier 28 is supplied with power supply potential Vcc via the drive transistor (not shown), the potential of other bit line BL or /BL rises to power supply potential Vcc.

In the boosted sense ground method, as described above, the potential of one of bit lines BL and /BL lowers to boosted ground potential Vss', while the potential of one of bit lines BL and /BL lowers to ground potential Vss in the normal read operation. Referring against to FIG. 27, when word line WL in memory cell 1 is at L-level and hence cell capacitor 3 stores data, the potential of bit line BL lowers only to ground potential Vss'. Therefore, the potential of word line WL is slightly lower than the potential of bit line BL. Therefore, transfer gate 2 is substantially strongly turned off, so that subthreshold current Isth flowing through transfer gate 2 is reduced.

Since so-called voltage-boosted sense ground method is employed, this embodiment 8 can improve a data holding performance of the memory cells and allows fast reading of data. Since the boosted ground lines are hierarchical, and ground potential Vss' is not supplied to segment boosted ground lines 57 in the unselected memory blocks, the power consumption of boosted ground potential generating circuit 54 is reduced. Therefore, the size of transistor 541 in boosted ground potential generating circuit 54 can be reduced, so that the layout area can be small.

[Embodiment 9]

Figure 21:
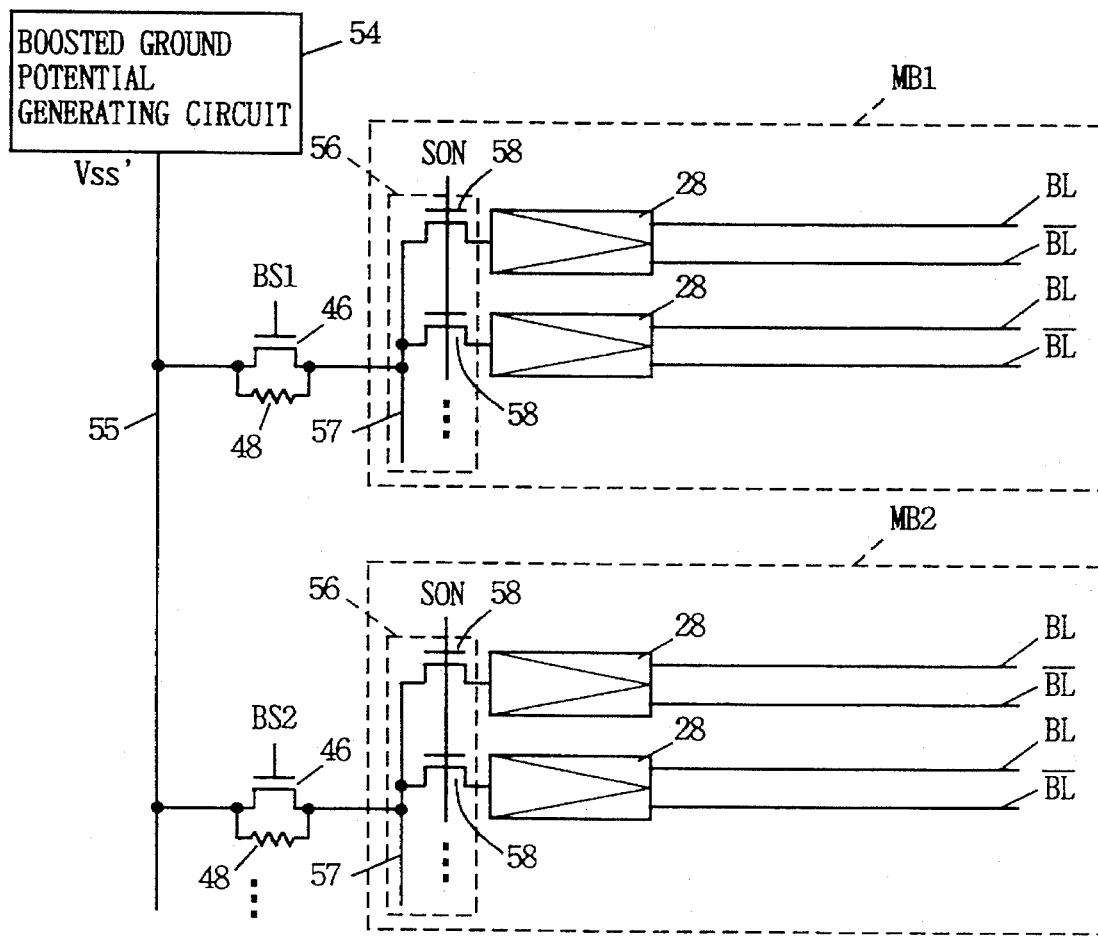
FIGS. 21 to 23 are block diagrams showing structures of DRAMs according to embodiments 9 to 11 of the invention, respectively.

FIG. 21 is a block diagram showing a structure of a DRAM according to the embodiment 9 of the invention. In this embodiment 9, as shown in FIG. 21, resistance 48 of a high value is connected in parallel to each select transistor 46. Therefore, boosted ground potential Vss' is slightly supplied even to segment boosted ground line 57 in the unselected memory block via resistance 48. Therefore, the potential of segment boosted ground line 57 in the unselected memory block is ensured to some extent.

[Embodiment 10]

Figure 22:
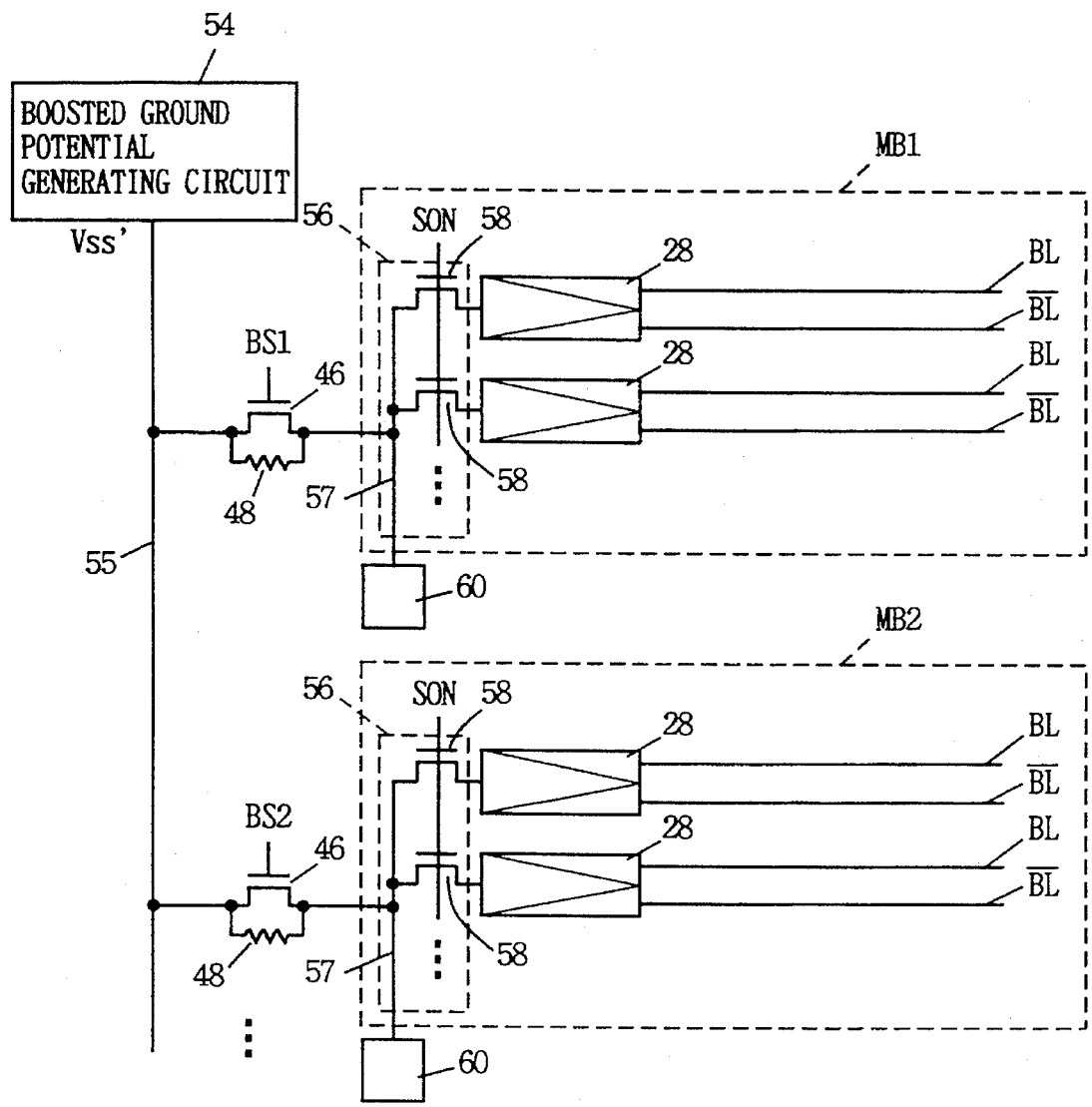

FIG. 22 is a block diagram showing a structure of a DRAM according to the embodiment 10 of the invention. Referring to FIG. 22, the embodiment 10 is provided with monitor pads 60 provided correspondingly to memory blocks MB1, MB2, . . . , respectively. Each monitor pad 60 is disposed outside the chip and is connected to corresponding segment boosted ground line 57.

This embodiment 10 allows an acceleration test of the DRAM. More specifically, ground potential Vss is initially supplied to monitor pad 60, so that the sense amplifier in the selected memory block is supplied with ground potential Vss instead of boosted ground potential Vss'. Thereby, subthreshold current Isth of memory cell increases, so that the acceleration test of disturb refresh can be performed. Since the amplitudes of potentials of bit lines BL and /BL are changed, the quantity of electric charges restored in the memory cell is changed. Therefore, the operation margin of sense amplifier 28 can be tested. By changing the potential applied to monitor pad 60 as described above, the acceleration test can be performed efficiently.

[Embodiment 11]

Figure 23:
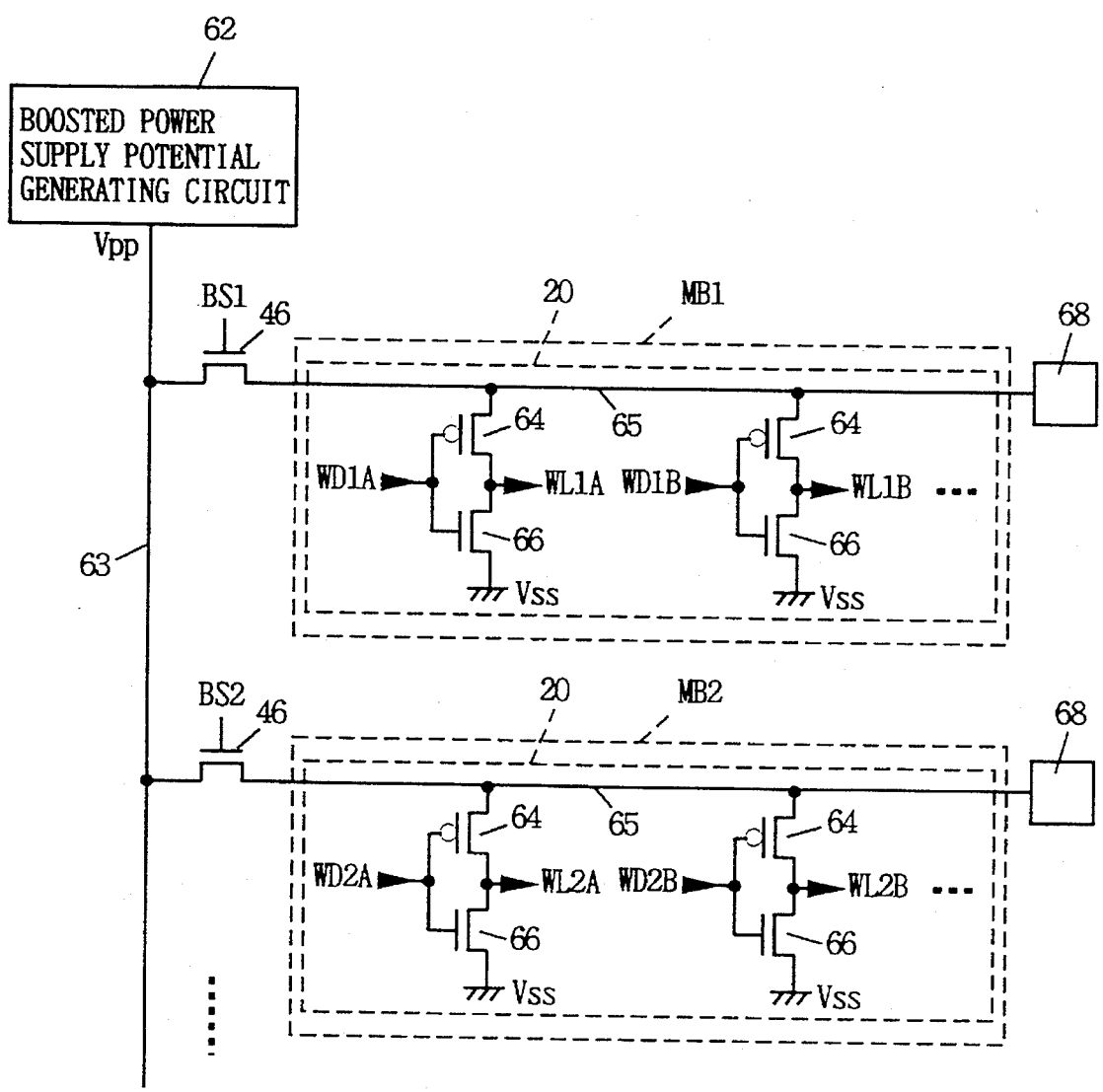

FIG. 23 is a block diagram showing a structure of a DRAM according to the embodiment 11 of the invention. In the embodiment 11 shown in FIG. 23, boosted power supply potential Vpp generated by boosted power supply potential generating circuit 62 is supplied to word drivers 20 in memory blocks MB1, MB2, . . . via select transistors 46, respectively. Each word driver 20 includes a plurality of CMOS inverters. Each inverter is formed of a P-channel MOS transistor 64 and an N-channel MOS transistor 66. In each word driver 20, source electrodes of all P-channel MOS transistors 64 are connected to one segment boosted power supply line 65. Segment boosted power supply lines 65 in all the memory blocks are connected to a global boosted power supply line 63 via select transistors 46. Monitor pad 68 is connected to segment boosted power supply line 65.

When any one of the block select signals attains H-level, the corresponding memory block is activated, and boosted power supply potential Vpp is supplied to word driver 20 in the activated memory block. Thereby, the potential of segment boosted power supply line 65 in this word driver 20 rises to boosted power supply potential Vpp.

In the unselected memory blocks, boosted power supply potential Vpp is not supplied to word drivers 20. Therefore, segment boosted power supply lines 65 in these word drivers 20 are electrically floated.

When one memory block (e.g., MB1) is selected, the potential of segment boosted power supply line 65 in word driver 20 of selected memory block MB1 rises to boosted power supply potential Vpp. Each inverter of word driver 20 produces word line drive signals WL1A, WL1B, . . . in response to decode signals WD1A, WD1B, . . . supplied from row decoder 18. For example, when decode signal WD1A attains L-level, corresponding P-channel MOS transistor 64 is turned on, so that boosted power supply potential Vbb is supplied as drive signal WL1A to word line WL via turned-on transistor 64. Thereby, the potential of word line WL rises from ground potential Vss to boosted power supply potential Vpp. Accordingly, all memory cells 1 connected to the potential-boosted word line WL can store sufficient electric charges.

Figure 24:
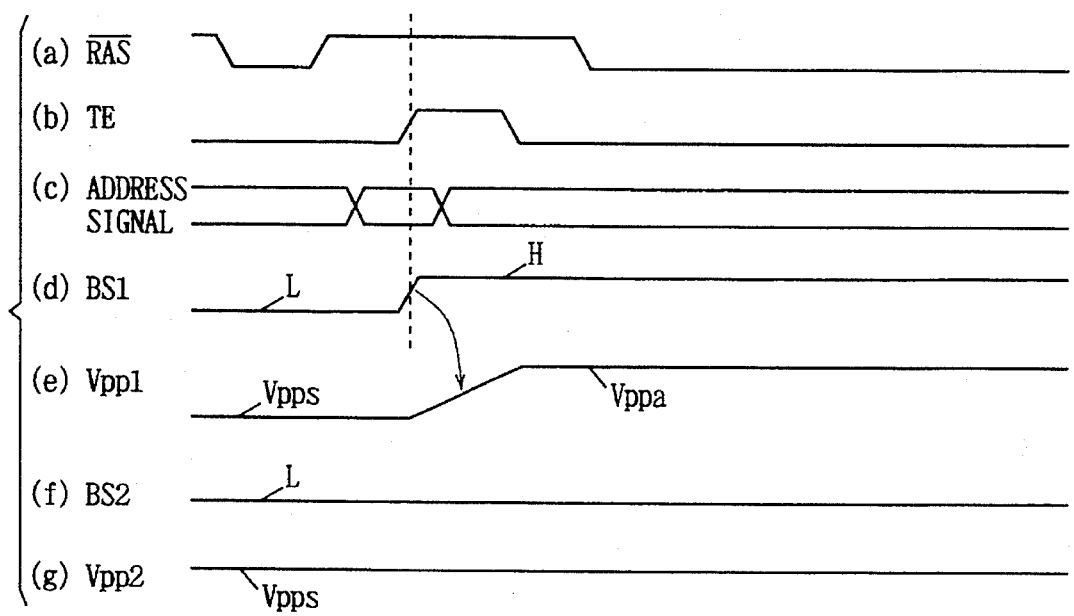
FIG. 24(a)–(g) is a timing chart showing operation in a test mode of the DRAM shown in FIG. 23.

FIG. 24 is a timing chart showing operation of the DRAM in the test mode. This DRAM takes in the address signal shown at (c) in FIG. 24 when a test signal TE generated in the chip attains H-level as shown at (b) in FIG. 24, and this take-in operation is performed not only in the active state but also in the standby state, i.e., when row address strobe signal /RAS is at H-level as shown at (a) in FIG. 24. Here, test signal TE is produced, for example, when a potential of a specific pin increases to or above boosted power supply potential Vpp in the WCBR cycle.

Figure 31:
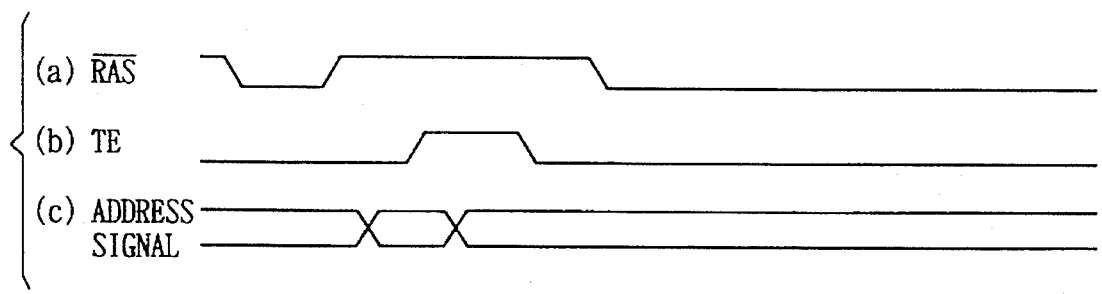

In the test mode, as described above, the address signal is taken in even during the standby state, and the address signal is decoded by the row decoder and is supplied to word driver 20. FIG. 31 is a timing chart showing operation in the conventional test mode. As can be apparent from comparison of the timing chart of FIG. 24 with that of FIG. 31, the address signal is taken in when test signal TE attains H-level. Further, when the block select signal BS1 attains H-level as shown at (d) in FIG. 24, the potential of segment boosted power supply line 65 in selected memory block MB1 rises. If a leak current flows from the segment boosted power supply line 65, the potential of segment boosted power supply line 65 does not rise to boosted power supply potential Vpp. The potential of segment boosted power supply line 65 is monitored via monitor pad 68. Therefore, when the potential of monitor pad 68 does not rise to boosted power supply potential Vpp, this means that the memory block includes a defect, and it is replaced with a spare memory block. Meanwhile, as shown at (f) and (g) in FIG. 24, block select signal BS2 maintains L-level in unselected memory block MB2, so that the potential of segment boosted power supply line 65 in the memory block MB2 does not rise.

According to this embodiment 11, boosted power supply potential Vpp is supplied only to segment boosted power supply line 65 in the selected memory block, and boosted power supply potential Vpp is not supplied to the segment boosted power supply line in the unselected memory block, so that the power consumption of boosted power supply potential generating circuit 65 is reduced. Since all segment boosted power supply lines 65 are connected to monitor pads 68, it is easy to determine whether each memory block is defective or not. Accordingly, the defective memory block can be efficiently replaced with the spare memory block.

[Embodiment 12]

Figure 25:
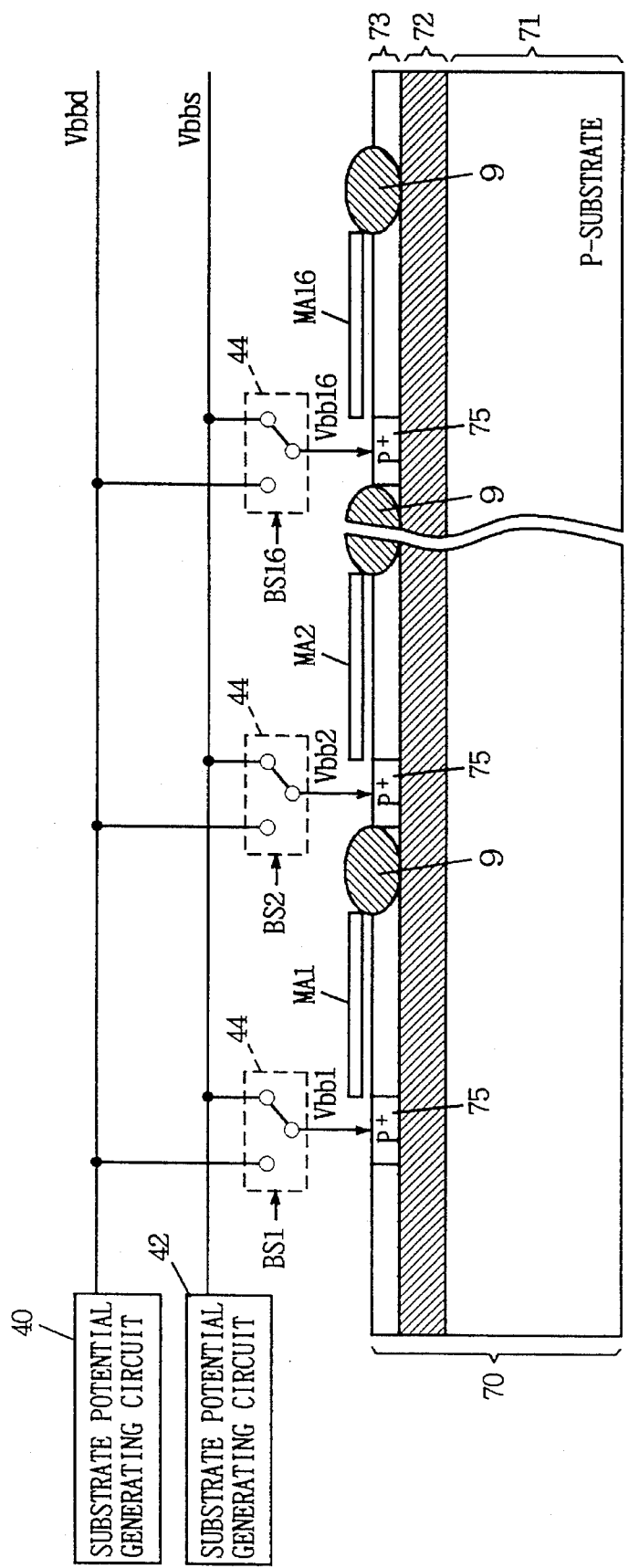
FIG. 25 conceptually shows a structure of a DRAM according to an embodiment 12 of the invention.

FIG. 25 conceptually shows a structure of a DRAM according to the embodiment 12 of the invention. Referring to FIG. 25, the embodiment 12 differs from the embodiment 1 in FIG. 1 in that memory cell arrays MA1–MA16 are formed on an SOI (Silicon On Insulator) substrate 70. SOI substrate 70 is formed of a P-type semiconductor substrate 71 made of, e.g., silicon, a buried oxide film 72 formed thereon and made of, e.g., $SiO_2$, and an SOI active layer 73 formed thereon and made of, e.g., silicon. SOI substrate 70 may be formed, e.g., by implanting an oxygen gas into a silicon substrate and thereby forming a buried oxide layer.

The memory blocks including memory cell arrays MA1–MA16 are isolated from each other by element isolating oxide films 9. SOI active layers 73 on which memory cell arrays MA1–MA16 are provided with $P^+$-type contact regions 75. Therefore, deep substrate potential Vbbd is supplied to contact region 75 in the selected memory block, and shallow substrate potential Vbbs is supplied to each of contact regions 75 in the unselected memory blocks.

Figure 26:
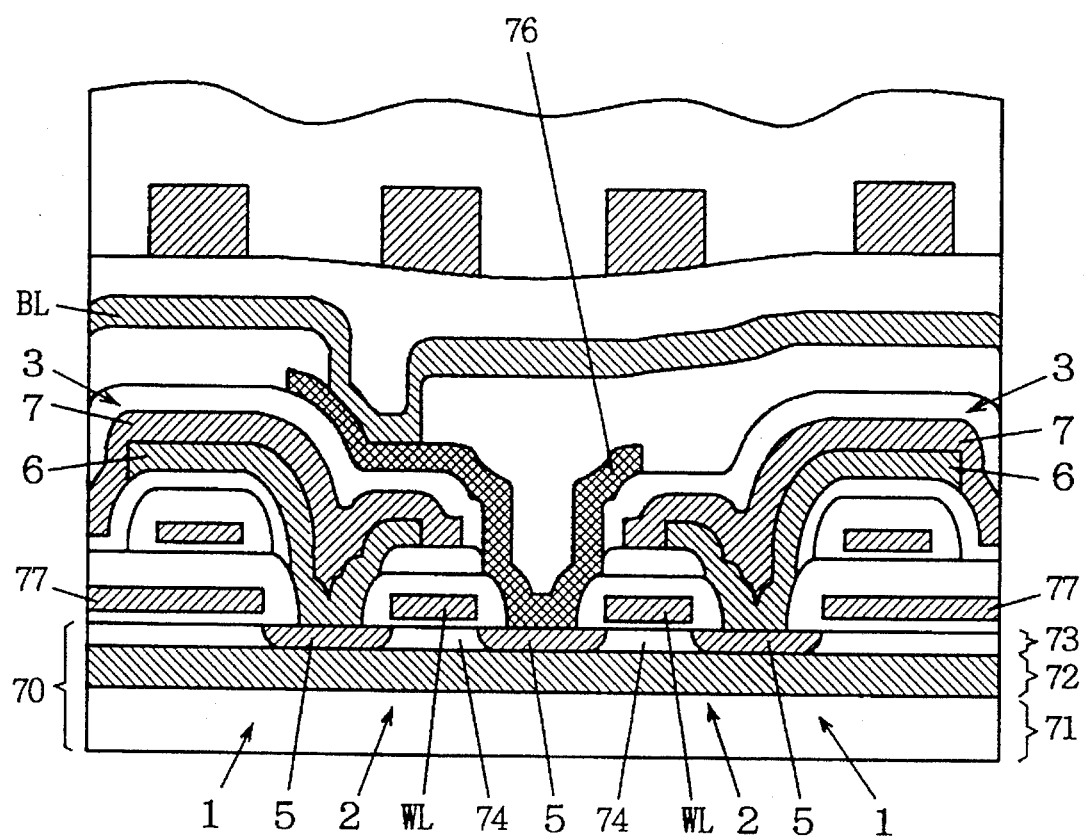
FIG. 26 is a fragmentary cross section showing a memory cell array shown in FIG. 25.

FIG. 26 is a fragmentary cross section showing the memory cell array shown in FIG. 25. Referring to FIG. 26, memory cell 1 is formed of transfer gate 2 and cell capacitor 3. Transfer gate 2 has a gate electrode forming word line WL, two N-type source/drain regions 5 and an N-type body region 74 formed between source/drain regions 5. One of source/drain regions 5 is connected to bit line BL via an intermediate layer 76. The other source/drain region 5 is connected to storage node 6. Cell plate 7 is formed on storage node 6 with an insulating layer therebetween. Storage node 6, the insulating layer and cell plate 7 form cell capacitor 3. Therefore, memory cell 2 has a so-called stacked structure.

Memory cells 1 in memory cell arrays MA1–MA16 are isolated from each other by so-called field shields. More specifically, field shield electrodes 77 are formed between memory cells 1. Therefore, the substrate potential supplied to contact region 75 is supplied to SOI layer 73 under field shield electrode 77, and is also supplied to body region 74.

According to the embodiment 12, since memory cell 1 is formed on SOI substrate 70 as described above, a so-called soft error hardly occurs. Since memory cells 1 are isolated by the field shields, and the memory cell arrays are isolated by LOCOS, the substrate potential supplied to contact region 75 is supplied to body regions 74 of transfer gates 2 in all memory cells 1. Therefore, body regions 74 are electrically fixed, so that a source/drain breakdown voltage is improved, and the subthreshold leak current in the selected memory cell 1 is reduced. Further, a leak current hardly flows from storage node 6 to semiconductor substrate 71 in the selected memory cell 1.

Although the embodiments of the invention have been described, the scope of the invention is not restricted to the embodiments described above. For example, there may be provided two cell plate potential generating circuits, two precharge potential generating circuits, two boosted ground potential generating circuits or two boosted power supply potential generating circuits, which generate mutually different potentials. It is clearly understood that the description is by way of illustration and example only and is not to be taken by way of limitation. The spirit and scope of the present invention being limited only by the terms of the appended claims.

What is claimed is:

1. A semiconductor memory device comprising:

a plurality of memory blocks each storing a plurality of data and being activated in response to a corresponding block select signal;

an internal potential generating means for generating one of a substrate potential, a cell plate potential, a precharge potential, and a boosted ground potential for said memory blocks; and select means for selecting the activated at least one memory block among said memory blocks and supplying said one potential generated by said internal potential generating means to said selected memory block.

2. The semiconductor memory device according to claim 1, further comprising:

second internal potential generating means for generating a second internal potential for said memory blocks, wherein said select means supplies to the unselected memory block said second internal potential generated by said second internal potential generating means.

3. The semiconductor memory device according to claim 1, wherein said select means includes a plurality of transistors provided correspondingly to said memory blocks, each being connected between an output node of said internal potential generating means generating one of said potentials and an input node of the corresponding memory block to be supplied with said one potential, and each being turned on in response to the block select signal supplied to the corresponding memory block.

4. The semiconductor memory device according to claim 3, wherein said select means further includes a plurality of resistance elements provided correspondingly to said memory blocks and each being connected in parallel to the corresponding transistor.

5. The semiconductor memory device according to claim 1, wherein each of said memory blocks includes a plurality of word lines disposed in a column direction, a plurality of bit line pairs disposed in a row direction, and a plurality of memory cells each disposed at a crossing between said word line and one of the paired bit lines, and each including a transistor having a gate electrode connected to the corresponding word line, a conductive electrode connected to the corresponding one of the paired bit lines and another conductive electrode, and a capacitor having an electrode connected to said another conductive electrode of said transistor; and said select means supplies said one potential as a substrate potential to substrates of said transistors in said plurality of memory cells.

6. The semiconductor memory device according to claim 1, wherein each of said memory blocks includes a plurality of word lines disposed in a column direction, a plurality of bit line pairs disposed in a row direction, and a plurality of memory cells each disposed at a crossing between said word line and one of the paired bit lines, and each including a transistor having a gate electrode connected to the corresponding word line, a conductive electrode connected to the corresponding one of the paired bit lines and another conductive electrode, and a capacitor having an electrode connected to said another conductive electrode of said transistor;

said transistors in said plurality of memory cells are formed on an SOI substrate and each has a source region, a drain region and a body region located between said source and drain regions; and said select means supplies said one potential as a substrate potential to said body regions of said transistors in said plurality of memory cells.

7. The semiconductor memory device according to claim 1, wherein each of said memory blocks includes a plurality of word lines disposed in a column direction, a plurality of bit line pairs disposed in a row direction, and a plurality of memory cells each disposed at a crossing between said word line and one of the paired bit lines, and each including a transistor having a gate electrode connected to the corresponding word line, a conductive electrode connected to the corresponding one of the paired bit lines and another conductive electrode, and a capacitor having one electrode connected to said another conductive electrode of said transistor and the other electrode; and said select means supplies said one potential as a cell plate potential to the other electrodes of said capacitors in said plurality of memory cells.

8. The semiconductor memory device according to claim 1, wherein each of said memory blocks includes a plurality of word lines disposed in a column direction, a plurality of bit line pairs disposed in a row direction, a plurality of memory cells each disposed at a crossing between said word line and one of the paired bit lines and connected to the corresponding word line and the corresponding one of the paired bit lines, a plurality of sense amplifier means provided correspondingly to said bit line pairs for each amplifying a potential difference between the corresponding paired bit lines, and a plurality of precharge means provided correspondingly to said bit line pairs for each supplying a predetermined precharge potential to the corresponding bit line pair before activation of the corresponding sense amplifier means; and said select means supplies said one potential as said precharge potential to said plurality of precharge means.

9. The semiconductor memory device according to claim 1, wherein each of said memory blocks includes a plurality of word lines disposed in a column direction, a plurality of bit line pairs disposed in a row direction, a plurality of memory cells each disposed at a crossing between said word line and one of the paired bit lines and connected to the corresponding word line and the corresponding of the paired bit lines, a plurality of sense amplifier means provided correspondingly to said bit line pairs for each amplifying a potential difference between the corresponding paired bit lines, and a plurality of sense amplifier driving means for supplying a boosted ground potential higher than a normal ground potential to said plurality of sense amplifier means and thereby driving said plurality of sense amplifier means; and said select means supplies said one potential as said boosted ground potential to said sense amplifier driving means.

10. The semiconductor memory device according to claim 9, further comprising a plurality of first pads provided correspondingly to said memory blocks, and each connected to an input node of the corresponding memory block to be supplied with said boosted ground potential.

11. A semiconductor memory device, comprising a plurality of memory blocks each storing a plurality of data and being activated in response to a corresponding block select signal;

first internal potential generating means for generating a first internal potential for said memory blocks; and select means for selecting the activated at least one memory block among said memory blocks and supplying said first internal potential generated by said first internal potential generating means to said selected memory block, wherein each of said memory blocks includes a plurality of word lines disposed in a column direction, a plurality of bit line pairs disposed in a row direction, a plurality of memory cells each disposed at a crossing between said word line and one of the paired bit lines and connected to the corresponding word line and the corresponding one of the paired bit lines, and word line driving means for selecting one of said word lines and supplying a boosted power supply potential higher than a normal power supply potential to the selected word line;

said select means supplies said first internal potential as said boosted power supply potential to said word line driving means; and said semiconductor memory device further comprises a plurality of pads provided correspondingly to said memory blocks and each connected to an input node of the corresponding memory block to be supplied with said boosted power supply potential.

* * * * *